(12) United States Patent
Hida et al.

(10) Patent No.: US 10,513,612 B2
(45) Date of Patent: Dec. 24, 2019

(54) DICHROIC AZO COMPOUND AND COMPOSITION CONTAINING THE SAME

(71) Applicant: Sumitomo Chemical Company, Limited, Tokyo (JP)

(72) Inventors: Noriyuki Hida, Osaka (JP); Haruki Okawa, Niihama (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 144 days.

(21) Appl. No.: 15/551,940

(22) PCT Filed: Feb. 17, 2016

(86) PCT No.: PCT/JP2016/054614
§ 371 (c)(1),
(2) Date: Aug. 18, 2017

(87) PCT Pub. No.: WO2016/133136
PCT Pub. Date: Aug. 25, 2016

(65) Prior Publication Data
US 2018/0072890 A1  Mar. 15, 2018

(30) Foreign Application Priority Data
Feb. 20, 2015  (JP) ................. 2015-032314

(51) Int. Cl.
*C09B 31/047* (2006.01)
*C09B 31/043* (2006.01)
(Continued)

(52) U.S. Cl.
CPC .......... *C09B 31/047* (2013.01); *C09B 31/043* (2013.01); *C09B 43/00* (2013.01);
(Continued)

(58) Field of Classification Search
CPC ..... C09B 31/00; C09B 31/047; C09B 31/043; C09K 19/24; C09K 19/3068;
(Continued)

(56) References Cited

U.S. PATENT DOCUMENTS 5,866,033 A  2/1999 Kaneko et al.
6,423,799 B1  7/2002 Berneth et al.
(Continued)

FOREIGN PATENT DOCUMENTS

CN  103123403 A  5/2013
CN  103173227 A  6/2013
(Continued)

OTHER PUBLICATIONS

Office Action dated Sep. 26, 2018 in CN Application No. 201680011197.6.
(Continued)

*Primary Examiner* — Ruiyun Zhang
(74) *Attorney, Agent, or Firm* — Panitch Schwarze Belisario & Nadel LLP

(57) ABSTRACT

A compound serving as a dichroic pigment which has a maximum absorption wavelength in a range of 350 nm to 510 nm is represented by the following Formula (1):

(1)

$$R^1 - \underset{(R^2)_m}{\bigcirc} - N=N - \underset{(R^3)_p}{\bigcirc} - N=N - \underset{(R^4)_q}{\bigcirc} - N\underset{H}{R^5}$$

In Formula (1), $R^1$ represents a hydrogen atom or a C1-C20 alkyl group; $R^2$ through $R^4$ are substituents which are not
(Continued)

hydrogen atoms and each independently represent a C1-C4 alkyl group; m, p, and q are each independently an integer of 0 to 2; and $R^5$ is (i) a C1-C10 alkyl group in which a hydrogen atom is substituted by at least one hydroxy group or (ii) a C1-C10 alkyl group which has carbon atoms and in which at least one —O— is inserted between the carbon atoms.

19 Claims, 3 Drawing Sheets

(51) Int. Cl.

| | |
|---|---|
| C09B 43/00 | (2006.01) |
| C09K 19/38 | (2006.01) |
| C09K 19/60 | (2006.01) |
| G02B 5/30 | (2006.01) |
| G02F 1/1335 | (2006.01) |
| H01L 51/00 | (2006.01) |
| H01L 51/52 | (2006.01) |
| C09K 19/24 | (2006.01) |
| C09K 19/30 | (2006.01) |
| G02F 1/13363 | (2006.01) |
| C09K 19/04 | (2006.01) |
| C09K 19/20 | (2006.01) |

(52) U.S. Cl.
CPC ......... *C09K 19/24* (2013.01); *C09K 19/3068* (2013.01); *C09K 19/3852* (2013.01); *C09K 19/601* (2013.01); *G02B 5/305* (2013.01); *G02B 5/3025* (2013.01); *G02F 1/133528* (2013.01); *H01L 51/004* (2013.01); *H01L 51/005* (2013.01); *H01L 51/0035* (2013.01); *H01L 51/0043* (2013.01); *H01L 51/0076* (2013.01); *H01L 51/5281* (2013.01); *C09K 2019/0448* (2013.01); *C09K 2019/2078* (2013.01); *G02F 1/13363* (2013.01); *G02F 1/133514* (2013.01); *G02F 2001/133638* (2013.01); *G02F 2202/022* (2013.01); *G02F 2202/40* (2013.01); *G02F 2413/01* (2013.01); *G02F 2413/05* (2013.01); *Y10T 428/10* (2015.01); *Y10T 428/1036* (2015.01); *Y10T 428/1041* (2015.01)

(58) Field of Classification Search
CPC ............. C09K 19/601; G02F 1/133528; G02F 1/133514; G02F 1/13363; G02F 2001/133638; G02F 2202/40; G02B 5/30; G02B 5/3025; Y10T 428/10; Y10T 428/1036; Y10T 428/1041
USPC ...... 428/1.1, 1.3, 1.31; 359/487.01, 487.021, 359/487.06, 489.02, 489.01; 526/218.1, 526/292.2
See application file for complete search history.

(56) References Cited

U.S. PATENT DOCUMENTS

| | | | |
|---|---|---|---|
| 2007/0024970 | A1 | 2/2007 | Lub et al. |
| 2010/0267858 | A1 | 10/2010 | Lub et al. |

FOREIGN PATENT DOCUMENTS

| | | | |
|---|---|---|---|
| CN | 103333083 | A | 10/2013 |
| JP | 63-1357 | B | 1/1988 |
| JP | H0539430 | A | 2/1993 |
| JP | 08-067879 | A | 3/1996 |
| JP | 10-060446 | A | 3/1998 |
| JP | 10-088142 | A | 4/1998 |
| JP | 10-088143 | A | 4/1998 |
| JP | 10-183121 | A | 7/1998 |
| JP | 10-212324 | A | 8/1998 |
| JP | 2007-510946 | A | 4/2007 |
| JP | 2013-101328 | A | 5/2013 |
| JP | 2013-210624 | A | 10/2013 |
| KR | 20130006318 | A | 1/2013 |
| TW | 201344255 | A | 11/2013 |

OTHER PUBLICATIONS

Int'l Search Report dated May 10, 2016 in Int'l Application No. PCT/JP2016/054614.
Int'l Preliminary Report on Patentability dated Aug. 31, 2017 in Int'l Application No. PCT/JP2016/054614.

DICHROIC AZO COMPOUND AND COMPOSITION CONTAINING THE SAME

CROSS-REFERENCE TO RELATED APPLICATION

This application is a Section 371 of International Application No. PCT/JP2016/054614, filed Feb. 17, 2016, which was published in the Japanese language on Aug. 25, 2016 under International Publication No. WO 2016/133136 A1, and the disclosure of which is incorporated herein by reference.

TECHNICAL FIELD

The present invention relates to (i) a compound serving as a dichroic pigment and (ii) a composition containing the compound.

BACKGROUND ART

Patent Literature 1 discloses a polarizing film containing a compound (dichroic pigment) which is dispersed in an aligned polymerizable liquid crystal compound and which absorbs dichroic light. However, Patent Literature 1 does not disclose a polarizing film which contains a dichroic pigment having a maximum absorption wavelength in a range of 350 nm to 510 nm and which is thus high in dichroic ratio.

Patent Literature 2 discloses, as a dichroic pigment having a maximum absorption wavelength in a range of 350 nm to 550 nm, a bisazo pigment having a 1,4-naphthyl structure. However, a polarizing film containing the bisazo pigment is low in dichroic ratio.

Patent Literature 3 discloses a polarizing film which has a high dichroic ratio. However, a dichroic pigment contained in the polarizing film has a maximum absorption wavelength of 518 nm or higher.

CITATION LIST

Patent Literature

[Patent Literature 1]
Japanese Patent Application Publication, Tokukai, No. 2007-510946 (Publication Date: Apr. 26, 2007)
[Patent Literature 2]
Japanese Examined Patent Application Publication, Tokukosho, No. 63-1357 (Publication Date: Jan. 12, 1988)
[Patent Literature 3]
Japanese Patent Application Publication, Tokukai, No. 2013-101328 (Publication Date: May 23, 2013)

SUMMARY OF INVENTION

Technical Problem

None of Patent Literatures 1 through 3 discloses a polarizing film which contains a dichroic pigment having a maximum absorption wavelength in a range of 350 nm to 510 nm and which is thus high in dichroic ratio. Therefore, there are demands for (i) a polarizing film which contains a dichroic pigment having a maximum absorption wavelength in a range of 350 nm to 510 nm and which is thus high in dichroic ratio, (ii) a novel compound serving as the dichroic pigment contained in the polarizing film, and (iii) a composition containing the compound.

The present invention has been made in view of the problem, and it is a main object of the present invention to provide (i) a novel compound serving as a dichroic pigment and (ii) a composition containing the compound.

Solution to Problem

In order to attain the object, the present invention includes the following.
<1> a Compound Represented by the Following Formula (1):

[Chem. 1]

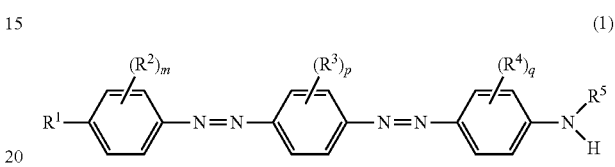

where: $R^1$ represents a hydrogen atom, a C1-C20 alkyl group, a C1-C20 alkoxy group, a C1-C20 acyl group, a C2-C20 alkoxycarbonyl group, a C1-C20 acyloxy group, or $-N(R^{10})(R^{11})$; $R^{10}$ represents a C1-C20 acyl group, a C1-C20 alkylsulfonyl group, or a C6-C20 arylsulfonyl group; and $R^{11}$ represents a hydrogen atom or a C1-C20 alkyl group; $R^{10}$ and $R^{11}$ can bond to each other, and form, with a nitrogen atom to which $R^{10}$ and $R^{11}$ bond, a ring including $-N-CO-$ or $-N-SO_2-$; at least one hydrogen atom of any of the alkyl group, the alkoxy group, the acyl group, the alkoxycarbonyl group, the acyloxy group, the alkylsulfonyl group, and the arylsulfonyl group can be substituted by a halogen atom, a hydroxy group, an unsubstituted amino group, or a substituted amino group; $-O-$ or $-NR^{20}-$ can be inserted between carbon atoms of any of the alkyl group and the alkoxy group; $R^{20}$ represents a hydrogen atom or a C1-C20 alkyl group;

$R^2$ through $R^4$ are substituents which are not hydrogen atoms and each independently represent a C1-C4 alkyl group, a C1-C4 alkoxy group, a halogen atom, or a cyano group; at least one hydrogen atom of any of the alkyl group and the alkoxy group can be substituted by a halogen atom or a hydroxy group; and m, p, and q are each independently an integer of 0 to 2; and $R^5$ is (i) a C1-C10 alkyl group in which a hydrogen atom is substituted by at least one hydroxy group or (ii) a C1-C10 alkyl group which has carbon atoms and in which at least one $-O-$ is inserted between the carbon atoms; and an aliphatic hydrocarbon chain in $R^5$ can be a linear chain or a branched chain.

<2> The compound described in <1>, configured so that the compound is represented by the following Formula (1'):

[Chem. 2]

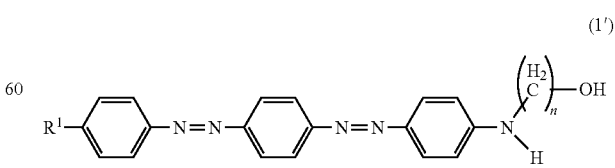

where: $R^1$ is identical to $R^1$ described above; n represents an integer of 1 to 10; and $-(CH_2)_n-$ represents a linear or branched C1-C10 aliphatic hydrocarbon chain.

<3> The compound described in <1> or <2>, configured so that the compound has a maximum absorption wavelength in a range of 350 nm to 510 nm.
<4> A composition including: a polymerizable liquid crystal compound; and a compound described in any one of <1> through <3>.
<5> The composition described in <4>, configured so that the polymerizable liquid crystal compound exhibits a smectic liquid crystal phase.
<6> The composition described in <4> or <5>, further containing a polymerization initiator.
<7> A polarizing film containing the compound described in any one of <1> through <3>.
<8> The polarizing film described in <7>, configured so that a maximum absorption wavelength ($\lambda_{max1}$) of the polarizing film is longer than a maximum absorption wavelength ($\lambda_{max2}$) of the compound represented by the Formula (1) or the Formula (1').
<9> The polarizing film described in <8>, configured so that a difference between the $\lambda_{max1}$ and the $\lambda_{max2}$ is 10 nm or more.
<10> The polarizing film described in any one of <7> through <9>, configured so that the polarizing film exhibits a Bragg peak in X-ray diffraction measurement.
<11> A liquid crystal display device including the polarizing film described in any one of <7> through <9>.
<12> A liquid crystal cell including: a polarizing film described in any one of <7> through <9>; a liquid crystal layer; and a base.
<13> The liquid crystal cell described in <12>, configured so that the polarizing film is provided between the base and the liquid crystal layer.
<14> The liquid crystal cell described in <13>, further including: a color filter provided between the base and the liquid crystal layer.
<15> A circularly polarizing plate including: a polarizing film described in any one of <7> through <9>; and a quarter-wave plate.
<16> An organic EL display device including: a polarizing film described in any one of <7> through <9>; and an organic EL element.
<17> An organic EL display device including: a circularly polarizing plate described in <15>; and an organic EL element.

Advantageous Effects of Invention

A compound in accordance with an embodiment of the present invention is a novel compound serving as a dichroic pigment which has a maximum absorption wavelength in a range of 350 nm to 510 nm. The compound can advantageously allow a polarizing film, which has a high dichroic ratio, to be obtained from a composition containing the compound.

DESCRIPTION OF EMBODIMENTS

Figure 1:
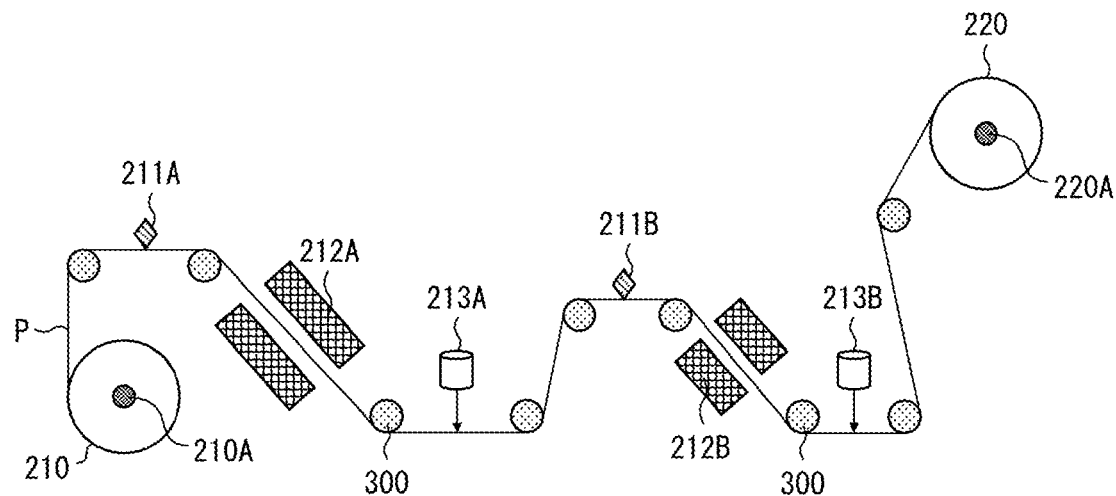
FIG. 1 is a front view schematically illustrating a producing apparatus which continuously produces polarizing films in accordance with an embodiment of the present invention.

The following description will discuss an embodiment of the present invention in detail. Note that numerical expressions such as "A to B" herein mean "A or more and B or less".

<Compound Represented by Formula (1)>

A compound represented by Formula (1) in accordance with an embodiment of the present invention (hereinafter also referred to as "compound (1)") has two azo groups which are preferably trans azo groups.

$R^1$ in Formula (1) represents a hydrogen atom, a C1-C20 alkyl group, a C1-C20 alkoxy group, a C1-C20 acyl group, a C2-C20 alkoxycarbonyl group, a C1-C20 acyloxy group, or —N($R^{10}$)($R^{11}$), and preferably represents a hydrogen atom, a C1-C20 alkyl group, a C1-C20 alkoxy group, a C1-C20 acyl group, a C2-C20 alkoxycarbonyl group, or a C1-C20 acyloxy group.

Examples of the C1-C20 alkyl group encompass unsubstituted linear or branched alkyl groups such as a methyl group, an ethyl group, an n-propyl group, an isopropyl group, an n-butyl group, an isobutyl group, a tert-butyl group, an n-pentyl group, an isopentyl group, a neopentyl group, an n-hexyl group, an n-heptyl group, an n-octyl group, an n-nonyl group, and an n-decyl group.

At least one hydrogen atom of the C1-C20 alkyl group can be substituted by a halogen atom (e.g. fluorine atom), a hydroxy group, or an unsubstituted or substituted amino group. Examples of the substituted amino group encompass amino groups, each of which is substituted by one or two C1-C20 alkyl groups, such as an N-methylamino group, an N-ethylamino group, an N,N-dimethylamino group, an N,N-diethylamino group. Examples of the alkyl group in which at least one hydrogen atom is substituted by a halogen atom or the like encompass: C1-C20 haloalkyl groups such as a fluoromethyl group, a trifluoromethyl group, a pentafluoroethyl group, a nonafluorobutyl group; C1-C20 hydroxyalkyl groups such as a hydroxymethyl group and a 2-hydroxyethyl group; and C1-C20 alkyl groups, each having an unsubstituted or substituted amino group, such as an aminomethyl group and a 2-(N,N-dimethylamino)ethyl group.

Between carbon atoms of the alkyl group, —O— or —$NR^{20}$— can be inserted. $R^{20}$ represents a hydrogen atom or a C1-C20 alkyl group. Examples of the C1-C20 alkyl group encompass C1-C20 alkyl groups similar to those described above. Examples of the alkyl group, in which —O— or —$NR^{20}$— is inserted between carbon atoms, encompass a methoxymethyl group, a 2-ethoxyethyl group, a 2-(2-ethoxyethoxy)ethyl group, and 2-[2-(ethylamino)ethylamino]ethyl group.

Examples of the C1-C20 alkoxy group encompass unsubstituted linear or branched alkoxy groups such as a methoxy group, an ethoxy group, an n-propoxy group, an isopropoxy group, an n-butoxy group, an isobutoxy group, a tert-butoxy group, an n-pentyloxy group, an isopentyloxy group, a neopentyloxy group, an n-hexyloxy group, an n-heptyloxy group, an n-octyloxy group, an n-nonyloxy group, and an n-decyloxy group.

At least one hydrogen atom of the C1-C20 alkoxy group can be substituted by a halogen atom (e.g. fluorine atom), a hydroxy group, or an unsubstituted or substituted amino group. Examples of the substituted amino group encompass amino groups, each of which is substituted by one or two C1-C20 alkyl groups, such as an N-methylamino group, an N-ethylamino group, an N,N-dimethylamino group, an N,N-diethylamino group. Examples of the alkoxy group in which at least one hydrogen atom is substituted by a halogen atom or the like encompass: C1-C20 haloalkoxy groups such as a fluoromethoxy group, a trifluoromethoxy group, a pentafluoroethoxy group, and a nonafluorobutoxy group; C1-C20 hydroxyalkoxy groups such as a hydroxymethoxy group and a 2-hydroxyethoxy group; and C1-C20 alkoxy groups, each having an unsubstituted or substituted amino group, such as an aminomethoxy group and a 2-(N,N-dimethylamino) ethoxy group.

Between carbon atoms of the alkoxy group, —O— or —$NR^{20}$— can be inserted. Examples of alkoxy group, in which —O— or —$NR^{20}$— is inserted between carbon atoms, encompass a methoxymethoxy group, a 2-ethoxyethoxy group, a 2-(2-ethoxyethoxy)ethoxy group, and 2-[2-(ethylamino)ethylamino]ethoxy group.

Examples of the C1-C20 acyl group encompass unsubstituted acyl groups such as a formyl group, an acetyl group, an ethylcarbonyl group, an n-propylcarbonyl group, an isopropylcarbonyl group, an n-butylcarbonyl group, an isobutylcarbonyl group, a tert-butylcarbonyl group, an n-pentylcarbonyl group, an isopentylcarbonyl group, a neopentylcarbonyl group, an n-hexylcarbonyl group, an n-heptylcarbonyl group, an n-octylcarbonyl group, an n-nonylcarbonyl group, and an n-decylcarbonyl group.

At least one hydrogen atom of the acyl group can be substituted by a halogen atom (e.g. fluorine atom), a hydroxy group, or an unsubstituted or substituted amino group. Examples of the substituted amino group encompass amino groups, each of which is substituted by one or two C1-C20 alkyl groups, such as an N-methylamino group, an N-ethylamino group, an N,N-dimethylamino group, an N,N-diethylamino group. Examples of the acyl group in which at least one hydrogen atom is substituted by a halogen atom or the like encompass C1-C20 haloacyl groups such as a trifluoroacetyl group, a pentafluoroethylcarbonyl group, and a nonafluorobutylcarbonyl group.

Examples of the C2-C20 alkoxycarbonyl group encompass unsubstituted alkoxycarbonyl groups such as a methoxycarbonyl group, an ethoxycarbonyl group, an n-propoxycarbonyl group, an isopropoxycarbonyl group, an n-butoxycarbonyl group, an isobutoxycarbonyl group, a tert-butoxycarbonyl group, an n-pentyloxycarbonyl group, an isopentyloxycarbonyl group, a neopentyloxycarbonyl group, an n-hexyloxycarbonyl group, an n-heptyloxycarbonyl group, an n-octyloxycarbonyl group, an n-nonyloxycarbonyl group, and an n-decyloxycarbonyl group.

At least one hydrogen atom of the alkoxycarbonyl group can be substituted by a halogen atom (e.g. fluorine atom), a hydroxy group, or an unsubstituted or substituted amino group. Examples of the substituted amino group encompass amino groups, each of which is substituted by one or two C1-C20 alkyl groups, such as an N-methylamino group, an N-ethylamino group, an N,N-dimethylamino group, an N,N-diethylamino group. Examples of the alkoxycarbonyl group in which at least one hydrogen atom is substituted by a halogen atom or the like encompass C2-C20 haloalkoxycarbonyl groups such as a fluoromethoxycarbonyl group, a trifluoromethoxycarbonyl group, a pentafluoroethoxycarbonyl group, and a nonafluorobutoxycarbonyl group.

Examples of the C1-C20 acyloxy group encompass unsubstituted acyloxy groups such as an acetyloxy group, an ethylcarbonyloxy group, an n-propylcarbonyloxy group, an isopropylcarbonyloxy group, an n-butylcarbonyloxy group, an isobutylcarbonyloxy group, a tert-butylcarbonyloxy group, an n-pentylcarbonyloxy group, an isopentylcarbonyloxy group, a neopentylcarbonyloxy group, an n-hexylcarbonyloxy group, an n-heptylcarbonyloxy group, an n-octylcarbonyloxy group, an n-nonylcarbonyloxy group, and an n-decylcarbonyloxy group.

At least one hydrogen atom of the acyloxy group can be substituted by a halogen atom (e.g. fluorine atom), a hydroxy group, or an unsubstituted or substituted amino group. Examples of the substituted amino group encompass amino groups, each of which is substituted by one or two C1-C20 alkyl groups, such as an N-methylamino group, an N-ethylamino group, an N,N-dimethylamino group, an N,N-diethylamino group. Examples of the acyloxy group in which at least one hydrogen atom is substituted by a halogen atom or the like encompass C1-C20 haloacyloxy groups such as a fluoroacetyloxy group, a trifluoroacetyloxy group, a pentafluoroethylcarbonyloxy group, and a nonafluorobutylcarbonyloxy group.

$R^{10}$ in —$N(R^{10})(R^{11})$ represents a C1-C20 acyl group, a C1-C20 alkylsulfonyl group, or a C6-C20 arylsulfonyl group. $R^{11}$ in —$N(R^{10})(R^{11})$ represents a hydrogen atom or a C1-C20 alkyl group. $R^{10}$ and $R^{11}$ can bond to each other, and form, with a nitrogen atom to which $R^{10}$ and $R^{11}$ bond, a ring including —N—CO— or —N—$SO_2$—. At least one hydrogen atom of the acyl group, the alkylsulfonyl group, and arylsulfonyl group in $R^{10}$ can be substituted by a halogen atom (e.g. fluorine atom), a hydroxy group, or an unsubstituted or substituted amino group. Examples of the substituted amino group encompass amino groups, each of which is substituted by one or two C1-C20 alkyl groups, such as an N-methylamino group, an N-ethylamino group, an N,N-dimethylamino group, an N,N-diethylamino group. Between carbon atoms of the alkyl group in $R^{11}$, —O— or —$NR^{20}$— can be inserted. Examples of the C1-C20 acyl group in $R^{10}$ encompass acyl groups similar to the C1-C20 acyl groups in $R^1$ described above. Examples of the acyl group, in which at least one hydrogen atom of the acyl group is substituted by a halogen atom or the like, encompass groups similar to those in $R^1$ described above.

Examples of the C1-C20 alkylsulfonyl group encompass unsubstituted alkylsulfonyl groups such as a methylsulfonyl group, an ethylsulfonyl group, and an n-propylsulfonyl group. Examples of the group in which at least one hydrogen atom of the alkylsulfonyl group is substituted by a halogen atom or the like encompass C1-C20 haloalkylsulfonyl groups such as a trifluoromethylsulfonyl group, a pentafluoroethylsulfonyl group, and a heptafluoro-n-propylsulfonyl group.

Examples of the C6-C20 arylsulfonyl group encompass a benzenesulfonyl group, and a p-toluenesulfonyl group. Examples of the group in which at least one hydrogen atom of the arylsulfonyl group is substituted by a halogen atom or the like encompass a p-trifluoromethylbenzenesulfonyl group.

Examples of the C1-C20 alkyl group in $R^{11}$ encompass alkyl groups similar to the C1-C20 alkyl groups in $R^1$. Examples of the alkyl group, in which at least one hydrogen atom of the alkyl group is substituted by a halogen atom or the like, encompass groups similar to those in $R^1$ described above.

Specific examples of $—N(R^{10})(R^{11})$ encompass an acylamino group, an ethylcarbonylamino group, an n-propylcarbonylamino group, an isopropylcarbonylamino group, an n-butylcarbonylamino group, an isobutylcarbonylamino group, a tert-butylcarbonylamino group, an n-pentylcarbonylamino group, an isopentylcarbonylamino group, a neopentylcarbonylamino group, an n-hexylcarbonylamino group, an n-heptylcarbonylamino group, an n-octylcarbonylamino group, an n-nonylcarbonylamino group, an n-decylcarbonylamino group, and a trifluoroacylamino group.

Examples of the ring, which (i) is formed by $R^{10}$ and $R^{11}$ (bonded to each other) together with a nitrogen atom to which $R^{10}$ and $R^{11}$ bond and (ii) contains —N—CO— or —N—SO$_2$—, encompass a 2-pyrrolidone-1-yl group.

$R^1$ is a (i) C1-C10 alkyl group which can have a halogen atom (preferably a fluorine atom), (ii) C1-C20 alkyl group in which —O— is inserted between carbon atoms of the alkyl group, (iii) a C1-C10 alkoxy group which can have a halogen atom (preferably a fluorine atom), (iv) a C1-C20 alkoxy group in which —O— is inserted between carbon atoms of the alkoxy group, (v) a C1-C10 acyl group which can have a halogen atom (preferably a fluorine atom), (vi) a C2-C10 alkoxycarbonyl group which can have a halogen atom (preferably a fluorine atom), (vii) a C1-C10 acyloxy group which can have a halogen atom (preferably a fluorine atom), or (viii) $—N(R^{10})(R^{11})$. $R^{10}$ is preferably a C1-C20 acyl group which can have halogen atom (preferably a fluorine atom). $R^{11}$ is preferably a hydrogen atom.

$R^1$ is more preferably (i) a linear C1-C10 alkyl group which can have a fluorine atom or (ii) $—N(R^{10})(R^{11})$. $R^{10}$ is more preferably a C1-C10 acyl group which can have a fluorine atom. $R^{11}$ is preferably a hydrogen atom.

$R^1$ is particularly preferably a linear C1-C10 alkyl group which can have a fluorine atom.

$R^2$ through $R^4$ in Formula (1) are substituents which are not hydrogen atoms and each independently represent a C1-C4 alkyl group, a C1-C4 alkoxy group, a halogen atom, or a cyano group. $R^2$ through $R^4$ can each be substituted in any position of a phenylene group.

Examples of the C1-C4 alkyl group encompass unsubstituted linear or branched alkyl groups such as a methyl group, an ethyl group, an n-propyl group, an isopropyl group, an n-butyl group, an isobutyl group, and a tert-butyl group.

At least one hydrogen atom of the C1-C4 alkyl group can be substituted by a halogen atom (e.g. fluorine atom) or a hydroxy group. Examples of the alkyl group in which at least one hydrogen atom is substituted by a halogen atom or the like encompass: C1-C4 haloalkyl groups such as a fluoromethyl group, a trifluoromethyl group, a pentafluoroethyl group, and a nonafluorobutyl group; and C1-C4 hydroxyalkyl groups such as a hydroxymethyl group and a 2-hydroxyethyl group.

Examples of the C1-C4 alkoxy group encompass unsubstituted linear or branched alkoxy groups such as a methoxy group, an ethoxy group, an n-propoxy group, an isopropoxy group, an n-butoxy group, an isobutoxy group, and a tert-butoxy group.

At least one hydrogen atom of the C1-C4 alkoxy group can be substituted by a halogen atom (e.g. fluorine atom) or a hydroxy group. Examples of the alkoxy group in which at least one hydrogen atom is substituted by a halogen atom or the like encompass: C1-C4 haloalkoxy groups such as a fluoromethoxy group, a trifluoromethoxy group, a pentafluoroethoxy group, and a nonafluorobutoxy group; and C1-C4 hydroxyalkoxy groups such as a hydroxymethoxy group and a 2-hydroxyethoxy group.

m, p, and q in Formula (1) are each independently an integer of 0 to 2, and more preferably 0.

$R^5$ is (i) a C1-C10 alkyl group in which a hydrogen atom is substituted by at least one hydroxy group or (ii) a C1-C10 alkyl group which has carbon atoms and in which at least one —O— is inserted between the carbon atoms. An aliphatic hydrocarbon chain in $R^5$ can be a linear chain or a branched chain.

The number of carbons in $R^5$ is 1 to 10, preferably 1 to 5, and more preferably 2 to 3.

Therefore, the compound (1) is particularly preferably a compound represented by Formula (1') in accordance with an embodiment of the present invention (hereinafter, such a compound will also be referred to as "compound (1')"). $R^1$ in Formula (1') is identical to $R^1$ described above. n is an integer of 1 to 10, preferably an integer of 1 to 5, and more preferably 2 or 3. —(CH$_2$)$_n$— in Formula (1') can be a linear aliphatic hydrocarbon chain or a branched aliphatic hydrocarbon chain.

Specific examples of each of the compound (1) and the compound (1') encompass compounds represented by the following Formulas (1-1) through (1-47):

[Chem. 3]

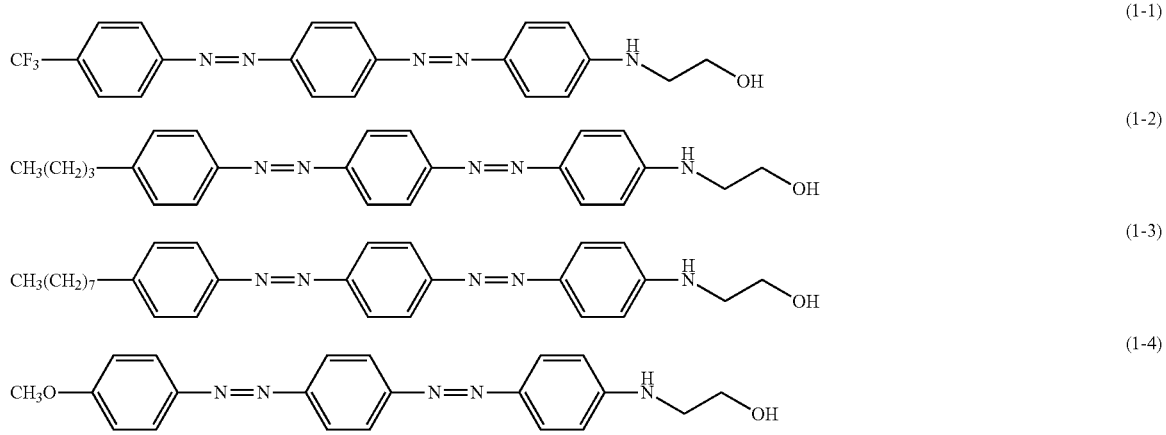

-continued
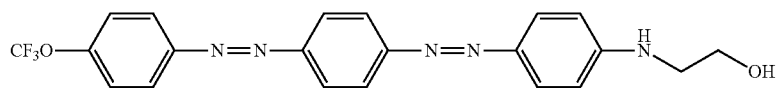 (1-5)
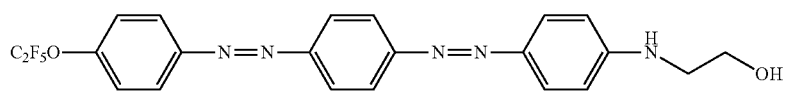 (1-6)
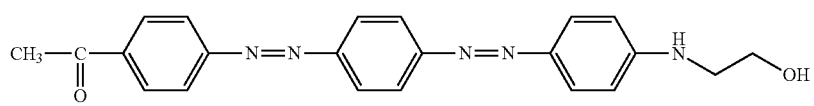 (1-7)
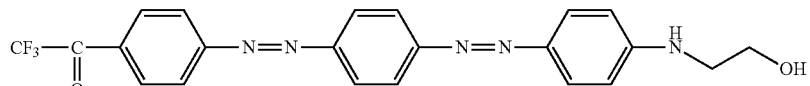 (1-8)
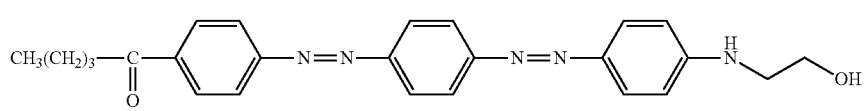 (1-9)
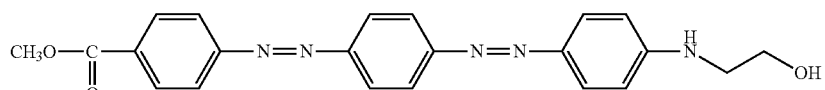 (1-10)
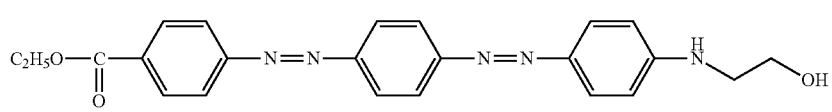 (1-11)
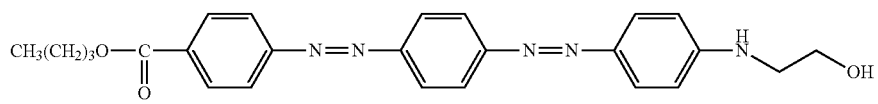 (1-12)
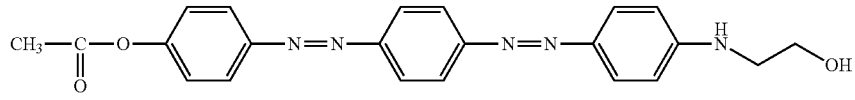 (1-13)
 (1-14)
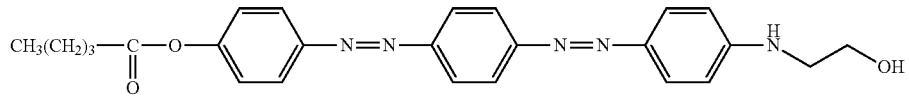 (1-15)
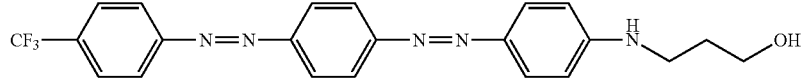 (1-16)
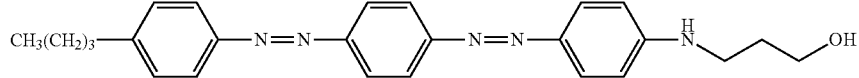 (1-17)
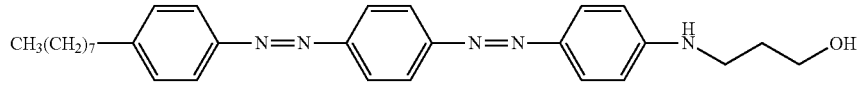 (1-18)
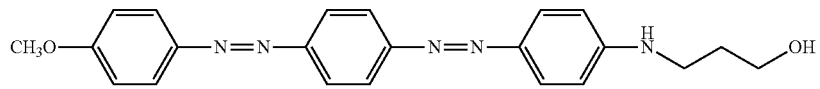 (1-19)

-continued
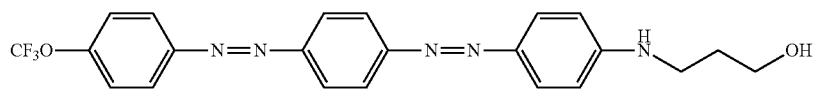
(1-20)
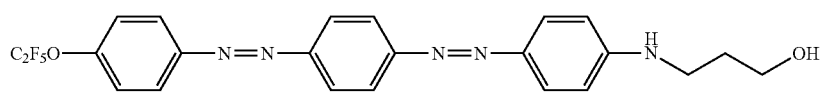
(1-21)
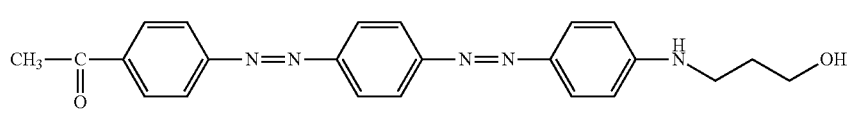
(1-22)
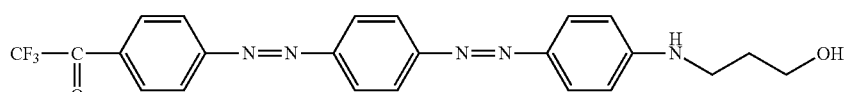
(1-23)
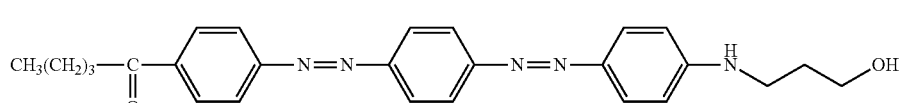
(1-24)
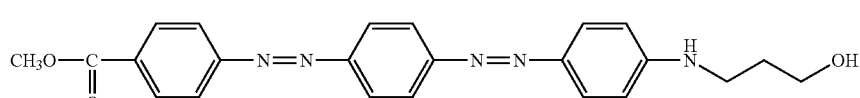
(1-25)
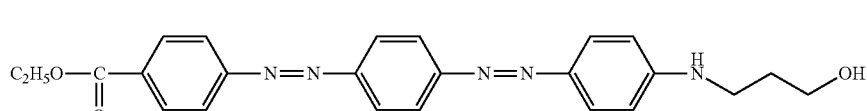
(1-26)
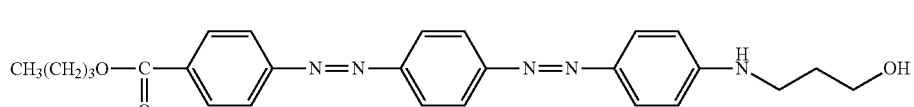
(1-27)
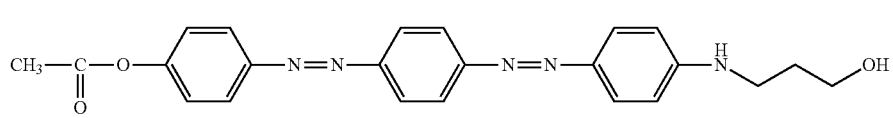
(1-28)
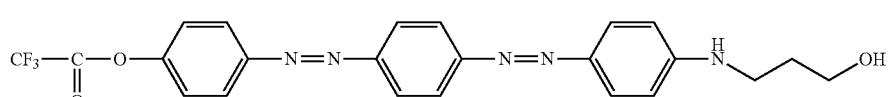
(1-29)
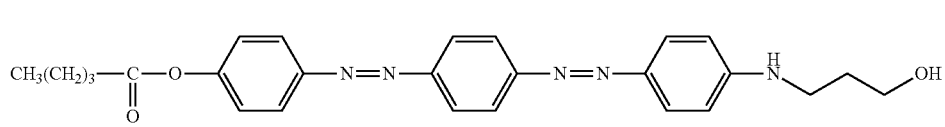
(1-30)
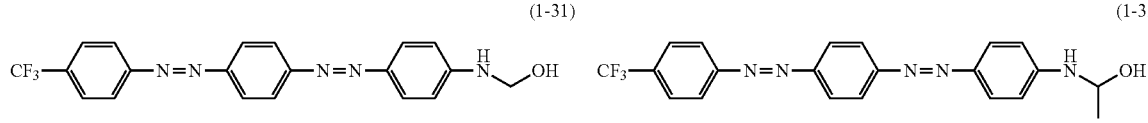
(1-31) (1-32)
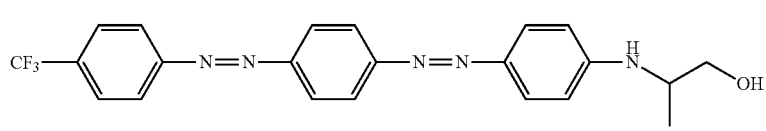
(1-33)
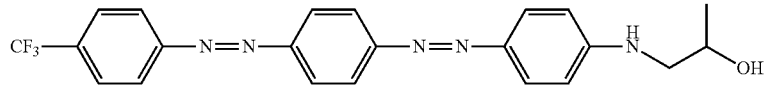
(1-34)

-continued (1-35) CF$_3$—C$_6$H$_4$—N=N—C$_6$H$_4$—N=N—C$_6$H$_4$—NH—CH(CH$_3$)CH$_2$CH$_2$OH (1-36) CF$_3$—C$_6$H$_4$—N=N—C$_6$H$_4$—N=N—C$_6$H$_4$—NH—CH$_2$CH(CH$_3$)CH$_2$OH (1-37) CF$_3$—C$_6$H$_4$—N=N—C$_6$H$_4$—N=N—C$_6$H$_4$—NH(CH$_2$)$_4$OH (1-38) CF$_3$—C$_6$H$_4$—N=N—C$_6$H$_4$—N=N—C$_6$H$_4$—NH(CH$_2$)$_5$OH (1-39) CF$_3$—C$_6$H$_4$—N=N—C$_6$H$_4$—N=N—C$_6$H$_4$—NH(CH$_2$)$_6$OH (1-40) CF$_3$—C$_6$H$_4$—N=N—C$_6$H$_4$—N=N—C$_6$H$_4$—NH(CH$_2$)$_7$OH (1-41) CF$_3$—C$_6$H$_4$—N=N—C$_6$H$_4$—N=N—C$_6$H$_4$—NH(CH$_2$)$_8$OH (1-42) CF$_3$—C$_6$H$_4$—N=N—C$_6$H$_4$—N=N—C$_6$H$_4$—NH(CH$_2$)$_9$OH (1-43) CF$_3$—C$_6$H$_4$—N=N—C$_6$H$_4$—N=N—C$_6$H$_4$—NH(CH$_2$)$_{10}$OH (1-44) CF$_3$—C$_6$H$_4$—N=N—C$_6$H$_4$—N=N—C$_6$H$_4$—NH—CH$_2$CH(CH$_2$OH)$_2$ (1-45) CF$_3$—C$_6$H$_4$—N=N—C$_6$H$_4$—N=N—C$_6$H$_4$—NH—CH$_2$CH(CH$_2$OH)(CH$_2$OCH$_3$)

(1-46) CF$_3$—C$_6$H$_4$—N=N—C$_6$H$_4$—N=N—C$_6$H$_4$—NH—CH$_2$CH$_2$OCH$_2$CH$_2$OH (1-47) CF$_3$—C$_6$H$_4$—N=N—C$_6$H$_4$—N=N—C$_6$H$_4$—NH—CH$_2$CH(OH)CH$_2$OH

Among the compounds listed above, the compounds represented by Formula (1-1), Formula (1-2), Formula (1-5), Formula (1-7), Formula (1-8), Formula (1-16), Formula (1-17), Formula (1-20), Formula (1-22), and Formula (1-23) are preferable. The compounds represented by Formula (1-2), Formula (1-5), Formula (1-17), and Formula (1-20) are more preferable.

The compound (1) can be produced by reacting a compound represented by Formula (2a):

[Chem. 4]

(2a) R$^1$—C$_6$H$_3$(R$^2$)$_m$—N=N—C$_6$H$_3$(R$^3$)$_p$—NH$_2$ (where R$^1$ through R$^3$, m, and p are identical to R$^1$ through R$^3$, m, and p described above.)

(hereinafter also referred to as "compound (2a)") with a compound represented by Formula (2b):

[Chem. 5]

(2b) (R$^4$)$_q$—C$_6$H$_{5-q}$—NH—CH$_2$—SO$_3$Na (where R$^4$ and q are identical to R$^4$ and q described above.)

(hereinafter also referred to as "compound (2b)") so as to obtain a compound represented by Formula (3a):

[Chem. 6]

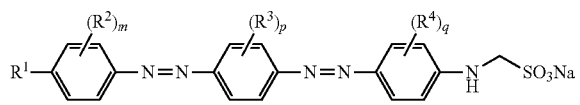
(3a)

(where $R^1$ through $R^4$, m, p, and q are identical to $R^1$ through $R^4$, m, p, and q described above.)
(hereinafter also referred to as "compound (3a)"), and then obtaining, from the compound (3a), a compound represented by Formula (3b):

[Chem. 7]

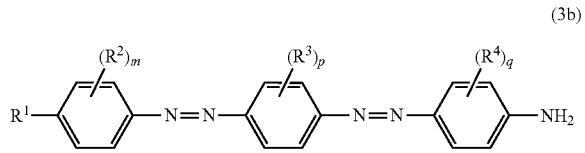
(3b)

(where $R^1$ through $R^4$, m, p, and q are identical to $R^1$ through $R^4$, m, p, and q described above.)
(hereinafter also referred to as "compound (3b)"), and then reacting an amino group of the compound (3b) with alkylene halohydrin (e.g. 2-iodoethanol) or halogenated dialkyl ether, so that one hydrogen atom of the amino group of the compound (3b) is substituted by (i) a hydroxyalkyl group or (ii) an alkyl group in which —O— is inserted. This process can be carried out according to, for example, the method disclosed in Chem Bio Chem, 2011, 12, 1712.

The compound (1) can be taken out, after the reaction ends, by an ordinary taking-out method such as recrystallization, reprecipitation, extraction, and various methods of chromatography.

The compound (1) is a novel compound which has a maximum absorption wavelength in a range of 350 nm to 510 nm, preferably in a range of 400 nm to 500 nm, more preferably in a range of 410 nm to 490 nm, and still more preferably in a range of 420 nm to 480 nm and which serves as a dichroic pigment. In particular, a polarizing film, which is obtained by aligning the compound (1) with a polymerizable liquid crystal compound, shows high dichroism. In addition, the compound (1), preferably the compound (1'), is light-resistant. Therefore a polarizing film including a compound in accordance with an embodiment of the present invention is light-resistant.

A composition in accordance with an embodiment of the present invention, which composition includes a polymerizable liquid crystal compound and the compound (1), will be described next. The composition in accordance with an embodiment of the present invention can include two or more kinds of compounds (1).

<Polymerizable Liquid Crystal Compound>

A polymerizable liquid crystal compound is a compound in which a molecule has a polymerizable group and which exhibits a liquid crystal phase by being aligned, and is preferably a compound which exhibits a liquid crystal phase by being aligned alone.

The "polymerizable group" means a group relevant to a polymerization reaction, and is preferably a photopolymerizable group. Note that a "polymerizable group" refers to a group which can be involved in a polymerization reaction by, for example, an active radical or an acid generated from a polymerization initiator described later. Examples of the polymerizable group encompass a vinyl group, a vinyloxy group, a 1-chlorovinyl group, an isopropenyl group, a 4-vinylphenyl group, an acryloyloxy group, a methacryloyloxy group, an oxiranyl group, and an oxetanyl group. Among these, an acryloyloxy group, a methacryloyloxy group, a vinyloxy group, an oxiranyl group, and an oxetanyl group are preferable, and an acryloyloxy group is more preferable.

The polymerizable liquid crystal compound can be a thermotropic liquid crystal type or a lyotropic liquid crystal type.

Examples of the polymerizable liquid crystal compound encompass (i) a compound exhibiting a nematic liquid crystal phase, (ii) a compound exhibiting a smectic liquid crystal phase, and (iii) a compound exhibiting both a nematic liquid crystal phase and a smectic liquid crystal phase. The polymerizable liquid crystal compound is preferably a compound exhibiting a smectic liquid crystal phase, and more preferably a compound exhibiting a higher-order smectic liquid crystal phase. The composition in accordance with an embodiment of the present invention, which composition includes a polymerizable liquid crystal compound exhibiting a smectic liquid crystal phase, can bring about a polarizing film having superior polarizability. The composition in accordance with an embodiment of the present invention can include two or more kinds of polymerizable liquid crystal compounds.

Even in a case where the compound (1) is being dispersed between dense molecular chains formed by a polymerizable liquid crystal compound exhibiting a smectic liquid crystal phase, the compound (1) can still show high dichroism. Therefore, a composition including the compound (1) can bring about a polarizing film which has a high dichroic ratio.

Examples of the higher-order smectic liquid crystal phase encompass a smectic B phase, a smectic D phase, a smectic E phase, a smectic F phase, a smectic G phase, a smectic H phase, a smectic I phase, a smectic J phase, a smectic K phase, and a smectic L phase. Among these, a smectic B phase, a smectic F phase, and a smectic I phase are preferable, and a smectic B phase is more preferable. In a case where the smectic liquid crystal phase exhibited by the polymerizable liquid crystal compound is any of these higher-order smectic phase, it is possible to obtain a polarizing film having a higher orientational order. A polarizing film, which is obtained from a composition including a polymerizable liquid crystal compound that exhibits a higher-order smectic liquid crystal phase in which an orientational order is high, exhibits a Bragg peak in X-ray diffraction measurement, which Bragg peak is derived from a higher-order structure as in a phase such as a hexatic phase and a crystal phase. A "Bragg peak" is a peak derived from surface periodic structure of molecular orientation. A periodic interval (order period) of a polarizing film obtained from the composition in accordance with an embodiment of the present invention is preferably 0.30 nm to 0.50 nm.

The type of liquid crystal phase exhibited by the polymerizable liquid crystal compound can be checked by, for example, the following method. That is, a proper base material is prepared. Then, the base material is coated with a solution containing the polymerizable liquid crystal compound and a solvent, so that a coated film is formed. Then, the coated film is subjected to a heat treatment or a decompression treatment, so that the solvent contained in the coated film is removed. Then, the coated film formed on the base material is heated to an isotropic phase temperature, and is then gradually cooled. This causes a liquid crystal phase to appear. Then, the liquid crystal phase is inspected by (i) texture observation with use of a polarizing microscope, (ii) X-ray diffraction measurement, or (iii) differential scanning calorimetry. In this inspection, for example, cooling the coated film to a first temperature can confirm that coated film exhibits a nematic liquid crystal phase. Further cooling the coated film gradually to a second temperature can confirm that the coated film exhibits a smectic liquid crystal phase.

The polymerizable liquid crystal compound is preferably a compound represented by Formula (4) (hereinafter also referred to as "compound (4)"):

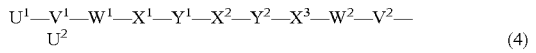

(4)

where: $X^1$, $X^2$, and $X^3$ each independently represent (i) a 1,4-phenylene group which can have a substituent or (ii) a cyclohexane-1,4-diyl group which can have a substituent, provided that at least one of $X^1$, $X^2$, and $X^3$ is a 1,4-phenylene group which can have a substituent; —$CH^2$— of a cyclohexane-1,4-diyl group can be substituted by —O—, —S—, or —NR—; R represents a C1-C6 alkyl group or a phenyl group;

$Y^1$ and $Y^2$ each independently represent a single bond, —$CH_2CH_2$—, —$CH_2O$—, —COO—, —OCOO—, —N=N—, —$CR^a$=$CR^b$—, —C≡C—, or —$CR^a$=N—; $R^a$ and $R^b$ each independently represent a hydrogen atom or a C1-C4 alkyl group;

$U^1$ represents a hydrogen atom or a polymerizable group; $U^2$ represents a polymerizable group;

$W^1$ and $W^2$ each independently represent a single bond, O, S, COO, or —OCOO—; and $V^1$ and $V^2$ each independently represent a C1-C20 alkanediyl group which can have a substituent, and —$CH_2$— of the alkanediyl group can be substituted by —O—, —S—, or —NH—.

In the compound (4), at least one of $X^1$, $X^2$, and $X^3$ is preferably a 1,4-phenylene group which can have a substituent.

The 1,4-phenylene group which can have a substituent is preferably an unsubstituted 1,4-phenylene group. The cyclohexane-1,4-diyl group which can have a substituent is preferably a trans-cyclohexane-1,4-diyl group which can have a substituent. The trans-cyclohexane-1,4-diyl group which can have a substituent is preferably an unsubstituted trans-cyclohexane-1,4-diyl group.

Examples of the substituent that can be included in the 1,4-phenylene group which can have a substituent or in the cyclohexane-1,4-diyl group which can have a substituent encompass (i) C1-C4 alkyl groups such as a methyl group, an ethyl group, an n-butyl group, (ii) a cyano group, and (iii) a halogen atom.

$Y^1$ is preferably a single bond, —$CH_2CH_2$—, or —COO—. $Y^2$ is preferably —$CH_2CH_2$— or —$CH_2O$—.

$U^1$ is a hydrogen atom or a polymerizable group, and is preferably a polymerizable group. $U^2$ is a polymerizable group. $U^1$ and $U^2$ are preferably both polymerizable groups, and more preferably both photopolymerizable groups. A polymerizable liquid crystal compound including a photopolymerizable group can advantageously be polymerized under low temperature conditions.

The polymerizable groups represented by $U^1$ and $U^2$ can be different from each other, but are preferably identical. Examples of the polymerizable group encompass a vinyl group, a vinyloxy group, a 1-chlorovinyl group, an isopropenyl group, a 4-vinylphenyl group, an acryloyloxy group, a methacryloyloxy group, an oxiranyl group, and an oxetanyl group. Among these, a vinyloxy group, an acryloyloxy group, a methacryloyloxy group, an oxiranyl group, and an oxetanyl group are preferable, and an acryloyloxy group is more preferable.

Examples of the alkanediyl group represented by $V^1$ and $V^2$ encompass a methylene group, an ethylene group, a propane-1,3-diyl group, a butane-1,3-diyl group, a butane-1,4-diyl group, a pentane-1,5-diyl group, a hexane-1,6-diyl group, a heptane-1,7-diyl group, an octane-1,8-diyl group, a decane-1,10-diyl group, a tetradecane-1,14-diyl group, and an icosane-1,20-diyl group. $V^1$ and $V^2$ are each preferably a C2-C12 alkanediyl group, and more preferably a C6-C12 alkanediyl group.

Examples of the substituent that can be included in the C1-C20 alkanediyl group which can have a substituent encompass a cyano group and a halogen atom. The alkanediyl group is preferably an unsubstituted alkanediyl group, and more preferably an unsubstituted linear alkanediyl group.

It is preferable that $W^1$ and $W^2$ are each independently a single bond or —O—.

Specific examples of the compound (4) encompass a compound represented by the following Formulas (4-1) through (4-43). In a case where the compound (4) has a cyclohexane-1,4-diyl group, the cyclohexane-1,4-diyl group is preferably in a trans-form.

[Chem. 8]

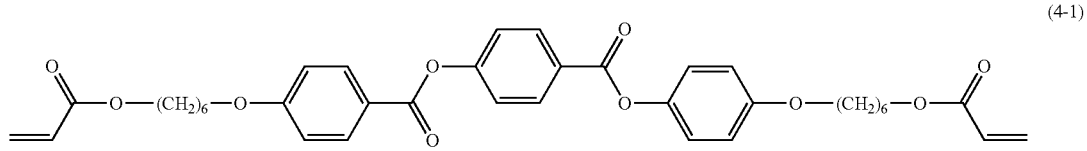

(4-1)

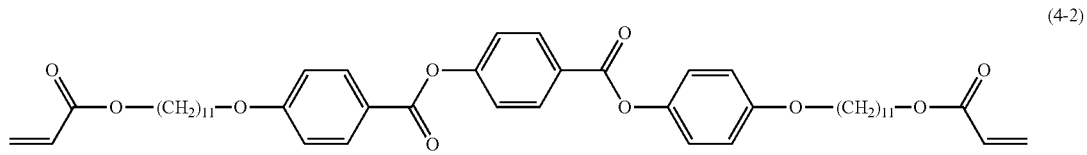

(4-2)

-continued
(4-3)
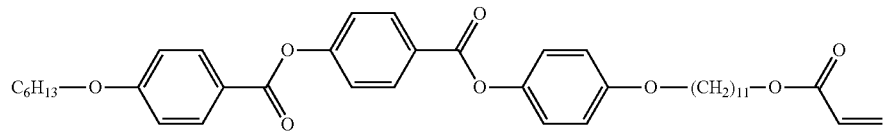
(4-4)
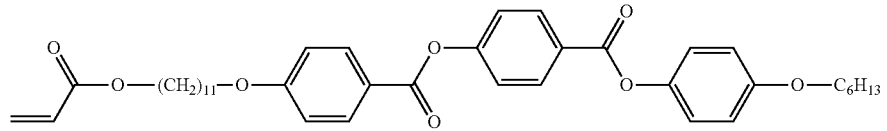
(4-5)
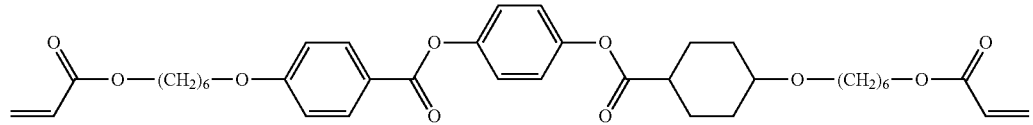
(4-6)
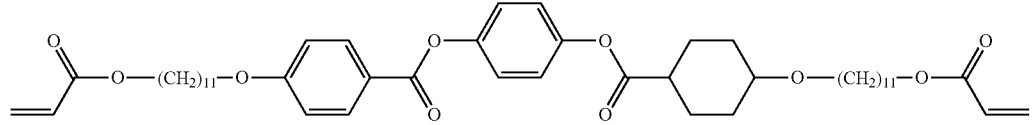
(4-7)
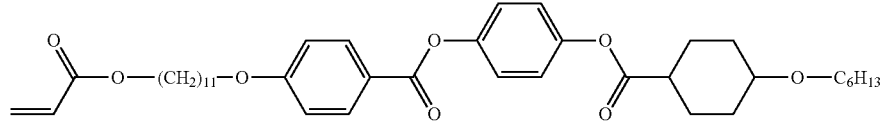
(4-8)
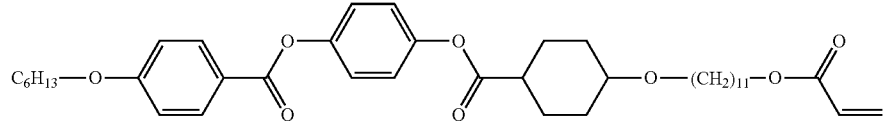
(4-9)
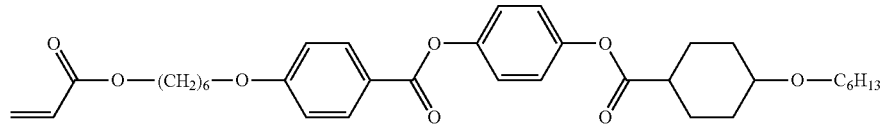
(4-10)
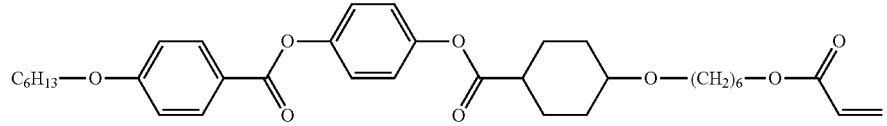
(4-11)
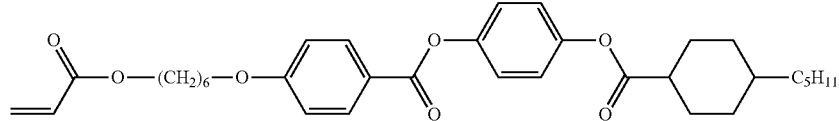
(4-12)
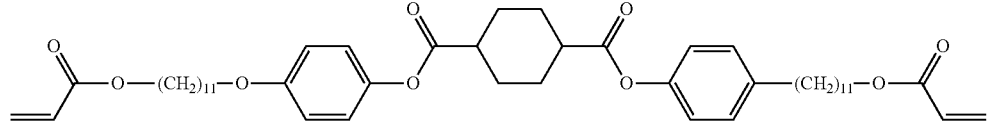
(4-13)
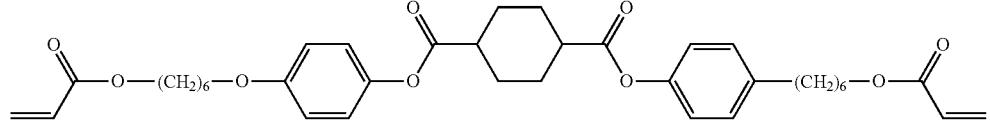

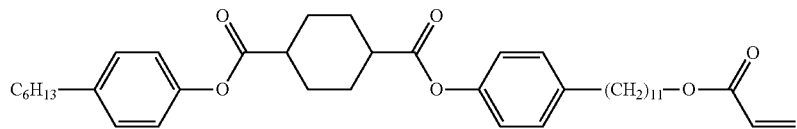
(4-14)
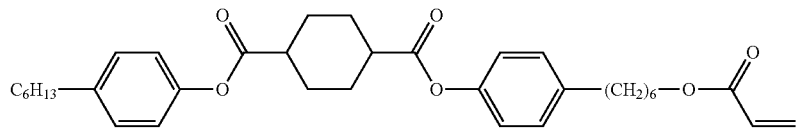
(4-15)
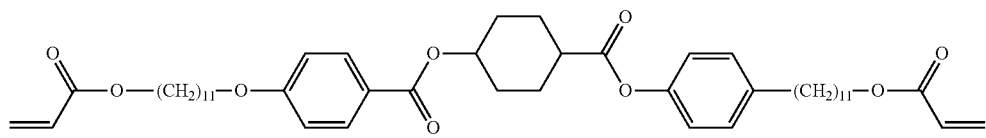
(4-16)
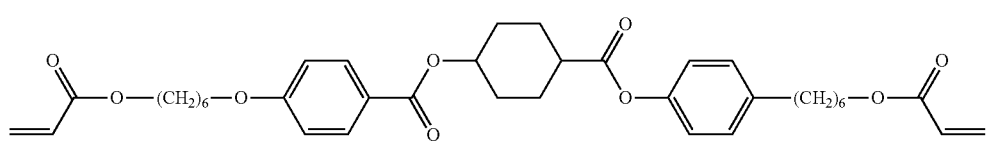
(4-17)
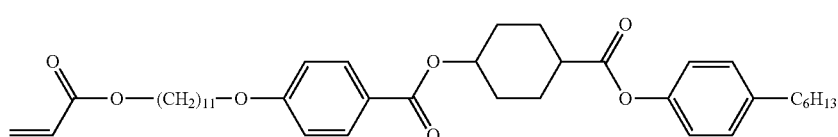
(4-18)
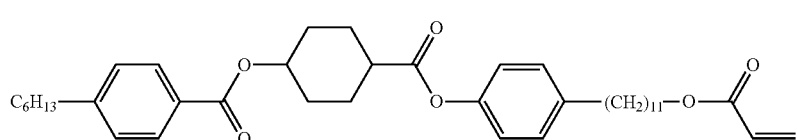
(4-19)
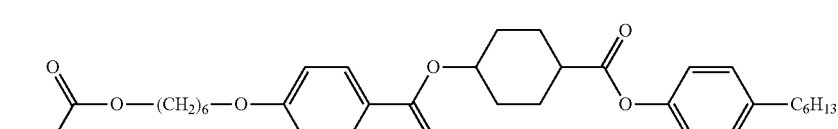
(4-20)
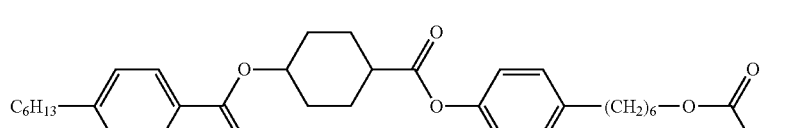
(4-21)
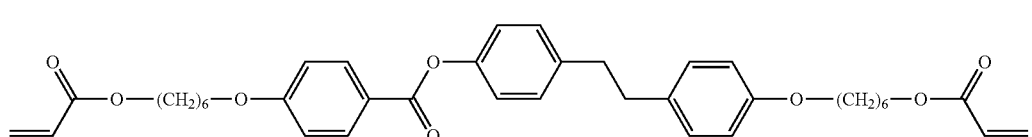
(4-22)
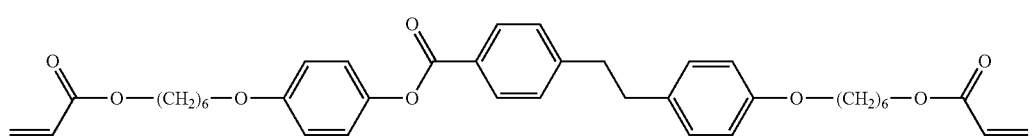
(4-23)
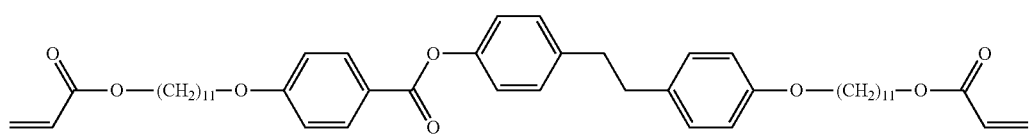
(4-24)

(4-25)
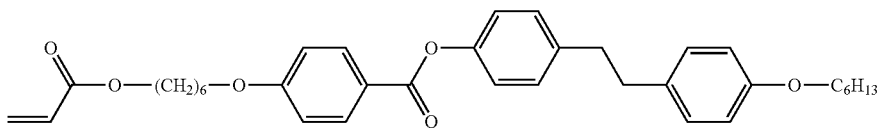
(4-26)
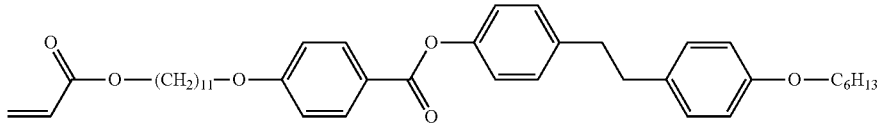
(4-27)
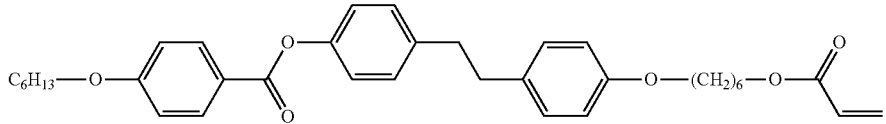
(4-28)
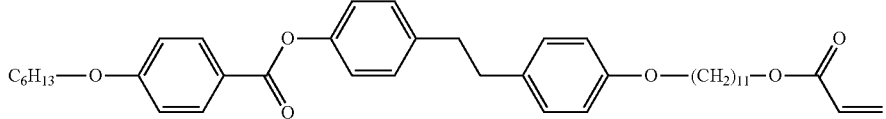
(4-29)
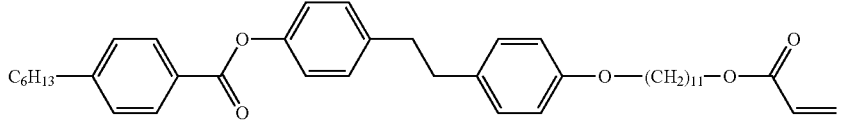
(4-30)
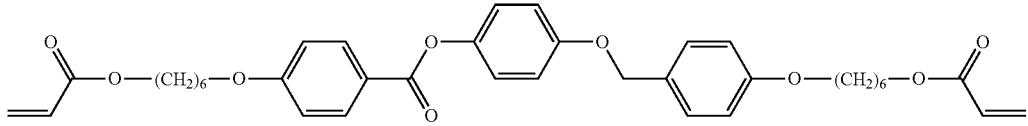
(4-31)
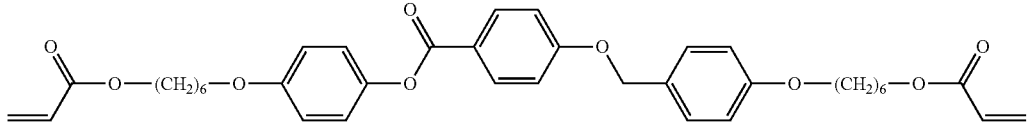
(4-32)
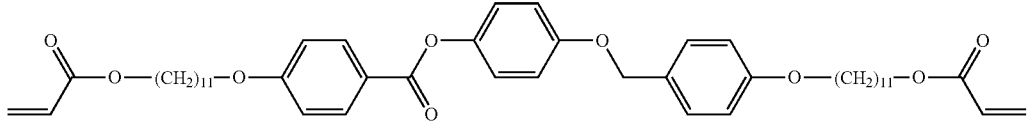
(4-33)
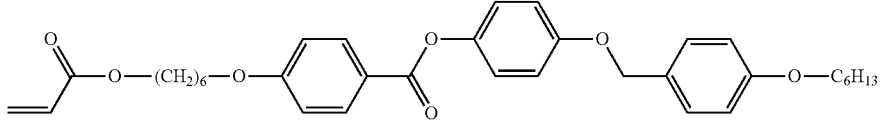
(4-34)
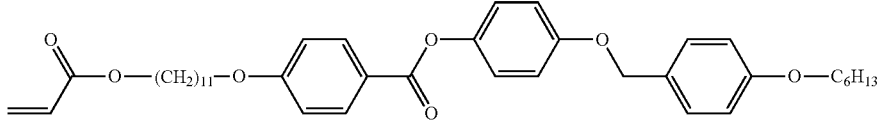
(4-35)
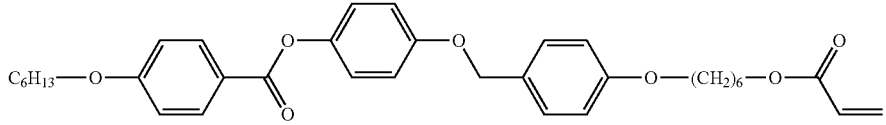

(4-36)
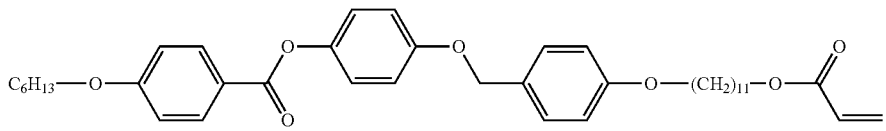

(4-37)
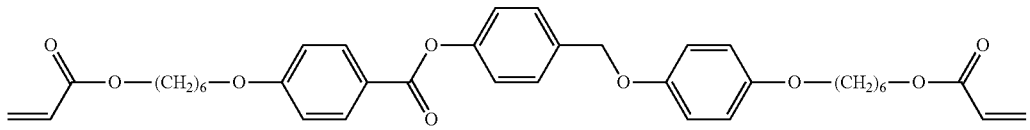

(4-38)
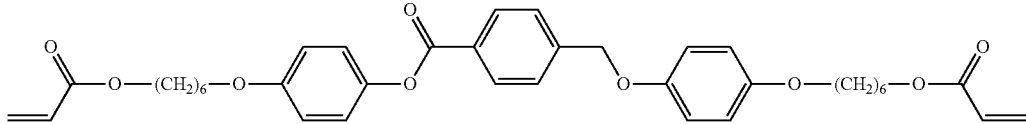

(4-39)
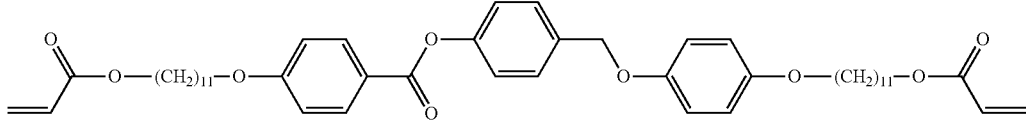

(4-40)
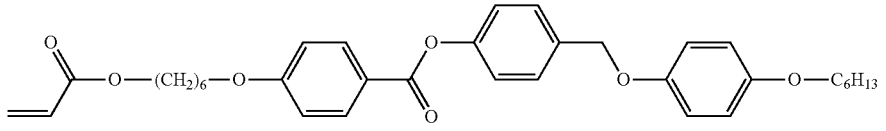

(4-41)
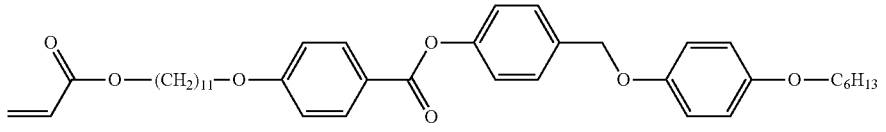

(4-42)
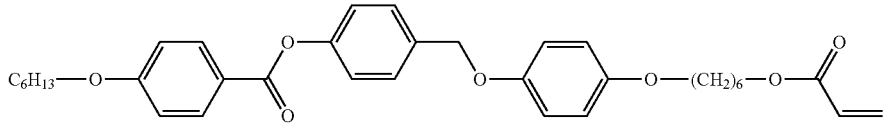

(4-43)
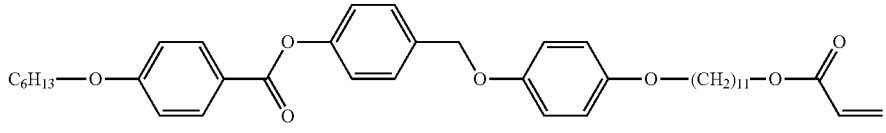

Among these, the compound (4) is preferably at least one selected from the group consisting of the compounds represented by Formula (4-5), Formula (4-6), Formula (4-7), Formula (4-8), Formula (4-9), Formula (4-10), Formula (4-11), Formula (4-12), Formula (4-13), Formula (4-14), Formula (4-15), Formula (4-22), Formula (4-24), Formula (4-25), Formula (4-26), Formula (4-27), Formula (4-28), and Formula (4-29).

The composition in accordance with an embodiment of the present invention can include two or more kinds of compounds (4). In a case where the two or more kinds of polymerizable liquid crystal compounds are combined, preferably at least one of the two or more kinds of polymerizable liquid crystal compounds is the compound (4), and more preferably two or more of the two or more kinds of polymerizable liquid crystal compounds are compounds (4). In a case where two or more kinds of polymerizable liquid crystal compounds are combined, it may be possible to temporarily maintain a liquid crystal phase even at a temperature which is a liquid crystal-crystal phase transition temperature or lower. A ratio at which two kinds of polymerizable liquid crystal compounds are to be combined is ordinarily 1:99 to 50:50, preferably 5:95 to 50:50, and more preferably 10:90 to 50:50.

The compound (4) can be produced by, for example, a method such as those disclosed in publicly known literature such as (i) Lub et al. Recl. Tray. Chim. Pays-Bas, 115, 321-328 (1996) and (ii) Japanese Patent No. 4719156.

In view of increasing an alignment property of the polymerizable liquid crystal compound, the polymerizable liquid crystal compound is contained in the composition in accordance with an embodiment of the present invention in an amount of preferably 70 parts by mass to 99.5 parts by mass, more preferably 80 parts by mass to 99 parts by mass, still more preferably 80 parts by mass to 94 parts by mass, and particularly preferably 80 parts by mass to 90 parts by mass, relative to 100 parts by mass of a solid content of the composition in accordance with an embodiment of the present invention. Note that the solid content refers to a total amount, excluding a solvent, of components in the composition in accordance with an embodiment of the present invention.

The composition in accordance with an embodiment of the present invention preferably contains a polymerization initiator and a solvent, and can further contain a photosensitizer, a polymerization inhibitor, and a leveling agent.

The compound (1) is contained in the composition in accordance with an embodiment of the present invention in an amount of ordinarily not more than 50 parts by mass, preferably 0.1 parts by mass to 10 parts by mass, and more preferably 0.1 parts by mass to 5 parts by mass, relative to 100 parts by mass of the polymerizable liquid crystal compound. In a case where the compound (1) is contained in an amount of not more than 50 parts by mass relative to 100 parts by mass of the polymerizable liquid crystal compound, a polarizing film to be obtained tends to have little disorder in alignment of the polymerizable liquid crystal compound and the compound (1).

<Solvent>

A solvent is preferably a solvent in which a polymerizable liquid crystal compound and the compound (1) can be completely dissolved. The solvent is also preferably a solvent that is inactive in a polymerization reaction of a polymerizable liquid crystal compound.

Examples of the solvent encompass alcohol solvents such as methanol, ethanol, ethylene glycol, isopropyl alcohol, propylene glycol, ethylene glycol methyl ether, ethylene glycol butyl ether, propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, 2-heptanone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; and chlorine-containing solvents such as chloroform and chlorobenzene. A single one of these solvents can be used alone, or two or more of these solvents can be used in combination.

In a case where the composition in accordance with an embodiment of the present invention contains a solvent, the solvent is preferably contained in an amount of 50% by mass to 98% by mass relative to the total amount of the composition in accordance with an embodiment of the present invention. In other words, a solid content of the composition in accordance with an embodiment of the present invention is preferably 2% by mass to 50% by mass. In a case where the solid content is not more than 50% by mass, the composition in accordance with an embodiment of the present invention becomes less viscous. This tends to cause a polarizing film, which is obtained from the composition in accordance with an embodiment of the present invention, to be substantially uniform in thickness and less likely to be uneven. The solid content can be appropriately decided in view of a thickness of a polarizing film to be produced.

<Polymerization Initiator>

A polymerization initiator is a compound which can initiate a polymerization reaction of a polymerizable liquid crystal compound. The polymerization initiator is preferably a photopolymerization initiator that generates an active radical by an effect of light.

Examples of the polymerization initiator encompass a benzoin compound, a benzophenone compound, an alkylphenone compound, an acylphosphine oxide compound, a triazine compound, an iodonium salt, and a sulfonium salt.

Examples of the benzoin compound encompass benzoin, benzoin methyl ether, benzoin ethyl ether, benzoin isopropyl ether, and benzoin isobutyl ether.

Examples of the benzophenone compound encompass benzophenone, methyl o-benzoylbenzoate, 4-phenylbenzophenone, 4-benzoyl-4'-methyldiphenyl sulfide, 3,3',4,4'-tetra(tert-butylperoxycarbonyl)benzophenone, and 2,4,6-trimethylbenzophenone.

Examples of the alkylphenone compound encompass oligomers of diethoxyacetophenone, 2-methyl-2-morpholino-1-(4-methylthiophenyl)propane-1-one, 2-benzyl-2-dimethylamino-1-(4-morpholinophenyl)butane-1-one, 2-hydroxy-2-methyl-1-phenylpropane-1-one, 1,2-diphenyl-2,2-dimethoxyethane-1-one, 2-hydroxy-2-methyl-1-[4-(2-hydroxyethoxy)phenyl]propane-1-one, 1-hydroxycyclohexylphenylketone, and 2-hydroxy-2-methyl-1-[4-(1-methylvinyl)phenyl]propane-1-one.

Examples of the acylphosphine oxide compound encompass a 2,4,6-trimethylbenzoyl diphenylphosphine oxide and a bis(2,4,6-trimethylbenzoyl)phenylphosphine oxide.

Examples of the triazine compound encompass 2,4-bis(trichloromethyl)-6-(4-methoxyphenyl)-1,3,5-triazine, 2,4-bis(trichloromethyl)-6-(4-methoxy naphthyl)-1,3,5-triazine, 2,4-bis(trichloromethyl)-6-(4-methoxy styryl)-1,3,5-triazine, 2,4-bis(trichloromethyl)-6-[2-(5-methylfuran-2-yl)ethenyl]-1,3,5-triazine, 2,4-bis(trichloromethyl)-6-[2-(furan-2-yl)ethenyl]-1,3,5-triazine, 2,4-bis(trichloromethyl)-6-[2-(4-diethylamino-2-methylphenyl)ethenyl]-1,3,5-triazine, and 2,4-bis(trichloromethyl)-6-[2-(3,4-dimethoxyphenyl)ethenyl]-1,3,5-triazine.

Examples of each of the iodonium salt and the sulfonium salt encompass salts represented by the following formula:

[Chem. 9]

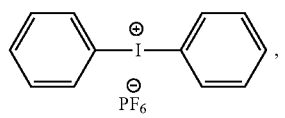

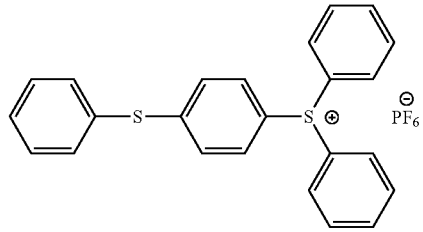

A single one of these polymerization initiators can be used alone, or two or more of these polymerization initiators can be used in combination.

The polymerization initiator can be a commercial product. Examples of the commercially available polymerization initiator encompass Irgacure (registered trademark) 907, 184, 651, 819, 250, and 369 (manufactured by Ciba Specialty Chemicals Inc.); SEIKUOL (registered trademark) BZ, Z, and BEE (manufactured by Seiko Chemical Co., Ltd.); Kayacure (registered trademark) BP100 and UVI-6992 (manufactured by The Dow Chemical Company); ADEKA OPTOMER SP-152 and SP-170 (manufactured by ADEKA CORPORATION); TAZ-A and TAZ-PP (manufactured by NIHON SIBER HEGNER K.K.); and TAZ-104 (manufactured by SANWA CHEMICAL CO., LTD.)

In a case where the composition in accordance with an embodiment of the present invention contains a polymerization initiator, the polymerization initiator is to be contained in the composition in accordance with an embodiment of the present invention in an amount of ordinarily 0.1 parts by mass to 30 parts by mass, preferably 0.5 parts by mass to 10 parts by mass, and more preferably 0.5 parts by mass to 8 parts by mass relative to 100 parts by mass of a polymerizable liquid crystal compound, so that alignment of the polymerizable liquid crystal compound is less likely to be disturbed.

<Photosensitizer>

In a case where the composition in accordance with an embodiment of the present invention contains a photopolymerization initiator, the composition in accordance with an embodiment of the present invention preferably contains a photosensitizer. In a case where the composition in accordance with an embodiment of the present invention contains a photopolymerization initiator and a photosensitizer, a polymerization reaction of a polymerizable liquid crystal compound tends to be promoted. Examples of the photosensitizer encompass xanthone compounds such as xanthone and thioxanthone (e.g. 2,4-diethyl thioxanthone and 2-isopropyl thioxanthone); anthracene compounds such as anthracene and alkoxy group-containing anthracene (e.g. dibutoxyanthracene); and phenothiazine; and rubrene.

In a case where the composition in accordance with an embodiment of the present invention contains a photosensitizer, the photosensitizer is to be contained in the composition in accordance with an embodiment of the present invention in an amount of preferably 0.1 parts by mass to 30 parts by mass, more preferably 0.5 parts by mass to 10 parts by mass, and still more preferably 0.5 parts by mass to 8 parts by mass, relative to 100 parts by mass of a polymerizable liquid crystal compound.

<Polymerization Inhibitor>

Examples of the polymerization inhibitor encompass radical scavengers such as hydrochinone, alkoxy group-containing hydrochinone, alkoxy group-containing catechol (e.g. butylcatechol), pyrogallol, 2,2,6,6-tetramethyl-1-piperidinyloxy radical; thiophenols; β-naphthylamines; and β-naphthols.

In a case where the composition in accordance with an embodiment of the present invention contains a polymerization inhibitor, it is possible to control a degree of progress of a polymerization reaction of a polymerizable liquid crystal compound.

In a case where the composition in accordance with an embodiment of the present invention contains a polymerization inhibitor, the polymerization inhibitor is to be contained in the composition in accordance with an embodiment of the present invention in an amount of preferably 0.1 parts by mass to 30 parts by mass, more preferably 0.5 parts by mass to 10 parts by mass, and still more preferably 0.5 parts by mass to 8 parts by mass, relative to 100 parts by mass of a polymerizable liquid crystal compound.

<Leveling Agent>

The leveling agent, which is an additive that has a function of adjusting fluidity of the composition in accordance with an embodiment of the present invention so as to further level a coated film to be obtained by application of the composition in accordance with an embodiment of the present invention. Examples of the leveling agent encompass a surfactant. Examples of a preferable leveling agent encompass (i) a leveling agent containing a polyacrylate compound as a main component and (ii) a leveling agent containing a fluorine atom-containing compound as a main component.

Examples of the leveling agent containing a polyacrylate compound as a main component encompass BYK-350, BYK-352, BYK-353, BYK-354, BYK-355, BYK-358N, BYK-361N, BYK-380, BYK-381, and BYK-392 (manufactured by BYK-Chemie GmbH).

Examples of the leveling agent containing a fluorine atom-containing compound as a main component encompass (i) MEGAFACE (registered trademark) R-08, R-30, R-90, F-410, F-411, F-443, F-445, F-470, F-471, F-477, F-479, F-482, F-483 (manufactured by DIC Corporation); Surflon (registered trademark) S-381, S-382, S-383, S-393, SC-101, SC-105, KH-40, and SA-100 (manufactured by AGC SEIMI CHEMICAL CO., LTD.); E1830 and E5844 (manufactured by DAIKIN Fine Chemicals Research Center); FTOP EF301, EF303, EF351, and EF352 (manufactured by Mitsubishi Materials Electronic Chemicals Co., Ltd.).

In a case where the composition in accordance with an embodiment of the present invention contains a leveling agent, the leveling agent is to be contained in the composition in accordance with an embodiment of the present invention in an amount of preferably 0.3 parts by mass to 5 parts by mass, and more preferably 0.5 parts by mass to 3 parts by mass, relative to 100 parts by mass of a polymerizable liquid crystal compound.

In a case where the amount of leveling agent contained falls within the above ranges, (i) it is easy to horizontally align a polymerizable liquid crystal compound and (ii) a polarizing film to be obtained tends to be smooth. If the amount of leveling agent contained relative to the weight of a polymerizable liquid crystal compound falls outside the ranges above, then a polarizing film to be obtained is likely to be easily uneven. The composition in accordance with an embodiment of the present invention can contain two or more kinds of leveling agents.

<Method for Producing Polarizing Film>

A polarizing film in accordance with the present invention, which film contains the compound (1), can be obtained by, for example, applying, onto a substrate, the composition in accordance with an embodiment of the present invention. The polarizing film is preferably produced by a method including the steps (A) through (C) below:

(A) applying the composition in accordance with an embodiment of the present invention onto a base material or onto a surface of a base material on which surface an alignment film is formed;

(B) aligning (i) a polymerizable liquid crystal compound contained in a coated film thus formed and (ii) the compound (1) contained in the coated film; and (C) polymerizing the polymerizable liquid crystal compound, having been aligned, by irradiating the polymerizable liquid crystal compound with an active energy ray.

<Step (A)>

<Base Material>

The base material may be a glass base material or a resin base material but is preferably a resin base material. Using a film base material made from resin makes it possible to produce a polarizing film which is thin.

The resin base material is preferably a transparent resin base material. "Transparent resin base material" refers to light-transmissive base material capable of transmitting light, particularly visible light. "Light-transmissive" refers to a property in which luminosity correction transmittance is 80% or more with respect to light waves having a wavelength in a range from 380 nm to 780 nm.

The base material is preferably a phase-difference film having a quarter-wave plate function (such a film is hereinafter also referred to as a "quarter-wave plate"). Using a quarter-wave plate as the base material makes it possible to obtain a circularly polarizing plate.

In a case where a quarter-wave plate is used, it is preferable to dispose the polarizing film and the quarter-wave plate in a manner such that a transmission axis of the polarizing film and a slow axis (light axis) of the quarter-wave plate form an angle that is substantially 45°. "Substantially 45°" refers, ordinarily, to a range of 45°±5°. It is also possible to obtain a circularly polarizing plate which functions as an optical compensation film (polarizing film) by causing the respective light axes of the polarizing film and the quarter-wave plate to be aligned or to intersect orthogonally.

The quarter-wave plate ordinarily has an optical characteristic represented by Formula (40) and preferably has an optical characteristic represented by Formula (41).

$$100 \text{ nm} < Re(550) < 160 \text{ nm} \quad (40)$$

$$130 \text{ nm} < Re(550) < 150 \text{ nm} \quad (41)$$

Where Re (550) represents in-plane phase difference value at a wavelength of 550 nm.

Furthermore, the quarter-wave plate preferably has a reverse wavelength dispersion property. "Reverse wavelength dispersion property" refers to a property where an in-plane phase difference at a short wavelength is greater than an in-plane phase difference at a long wavelength. The reverse wavelength dispersion property preferably satisfies the optical characteristics represented by Formula (50) and Formula (51).

$$Re(450)/Re(550) \leq 1.00 \quad (50)$$

$$1.00 \leq Re(630)/Re(550) \quad (51)$$

Where Re ($\lambda$) represents an in-plane phase difference with respect to light having a wavelength of $\lambda$ nm. With a circularly polarizing plate which includes a quarter-wave plate having the optical characteristics represented by Formula (50) and Formula (51), it is possible to obtain a characteristic of uniform polarization conversion with respect to light of each wavelength in the visible light range. Such a circularly polarizing plate therefore tends to excel in terms of antireflectiveness.

The base material may be a phase-difference film having a half-wave plate function.

Examples of resin of which the plastic base material can be made include polyolefins such as polyethylene, polypropylene, and a norbornene polymer; cyclic olefinic resins; polyvinyl alcohol; polyethylene terephthalate; polymethacrylic acid ester; polyacrylic ester; cellulose esters such as triacetyl cellulose, diacetyl cellulose, and cellulose acetate propionate; polyethylene naphthalate; polycarbonate; polysulfone; polyether sulfone; polyether ketone; polyphenylene sulfide and polyphenylene oxide; and the like. The resin is preferably cellulose ester, cyclic olefinic resin, polycarbonate, polyether sulfone, polyethylene terephthalate, or polymethacrylic acid ester.

Cellulose ester is a compound obtained by esterifying at least a part of a hydroxyl group contained in cellulose. Cellulose ester is available as a commercial product. A base material containing cellulose ester is also available as a commercial product. Examples of a commercially available base material containing cellulose ester include: "Fuji TAC (registered trademark) film" (manufactured by FujiFilm Corporation); "KC8UX2M", "KC8UY", and "KC4UY" (each manufactured by KONICA MINOLTA JAPAN, INC.).

Cyclic olefinic resin is a resin including a polymer or copolymer of a cyclic olefin such as a norbornene monomer or polycyclic norbornene monomer. The cyclic olefinic resin may include a ring-opened structure and may be a resin obtained by hydrogenating a cyclic olefinic resin containing a ring-opened structure. The cyclic olefinic resin may contain a structural unit derived from chain olefin and may contain a structural unit derived from a vinyl aromatic compound, to the extent that transparency of the cyclic olefinic resin is not greatly impaired and hygroscopicity of the cyclic olefinic resin is not greatly increased. The cyclic olefinic resin may have a polar group introduced in a molecule thereof.

Examples of the chain olefin include ethylene and propylene. Examples of the vinyl aromatic compound include styrene, $\alpha$-methylstyrene, and a styrene which can have an alkyl group.

In a case where the cyclic olefinic resin is a copolymer of (i) cyclic olefin and (ii) a chain olefin or a vinyl aromatic compound, a structural unit derived from the cyclic olefin is contained in an amount that is ordinarily 50 mol % or less and preferably 15 mol % to 50 mol %, relative to all structural units of the copolymer.

In a case where the cyclic olefinic resin is a terpolymer composed of cyclic olefin, a chain olefin, and a vinyl aromatic compound, a structural unit derived from the chain olefin is contained in an amount that is ordinarily 5 mol % to 80 mol % relative to all structural units of the copolymer, and a structural unit derived from the vinyl aromatic compound is contained at a proportion that is ordinarily 5 mol % to 80 mol % relative to all structural units of the copolymer. Such a terpolymer is advantageous in that it enables a relative reduction in the used amount cyclic olefin which is costly.

The cyclic olefinic resin is available as a commercial product. Examples of commercially available cyclic olefinic resins include "Topas" (Registered Trademark) (manufactured by Ticona (Germany)), "ARTON" (Registered Trademark) (manufactured by JSR Corporation), "ZEONOR" (Registered Trademark) and "ZEONEX" (Registered Trademark) (each manufactured by Zeon Corporation), and "APEL" (Registered Trademark) (manufactured by Mitsui Chemicals, Inc.). Such a cyclic olefinic resin can be made into the base material by film formation by, for example, publicly-known means such as a solvent cast method or a melt extrusion method. Examples of commercially available base materials containing cyclic olefinic resin include "Esushina" (Registered Trademark) and "SCA40" (Registered Trademark) (each manufactured by SEKISUI CHEMICAL CO., LTD.), and "ZEONOR FILM" (Registered Trademark) (manufactured by Optes Co., Ltd.).

The base material may be subjected to a surface treatment. Examples of a method for the surface treatment include a method of corona treating or plasma treating a surface of the base material, under atmosphere conditions ranging from a vacuum to atmospheric pressure; a method of laser treating a surface of the base material; a method of ozone treating a surface of the base material; a method of performing a saponification treatment on a surface of the base material; a method of flame treating a surface of the base material; a method of applying a coupling agent to a surface of the base material; a method of performing a primer treatment on a surface of the base material; and a graft polymerization method involving (i) causing a reactive monomer or reactive polymer to adhere to a surface of the base material and (ii) thereafter, causing a reaction by irradiating the base material with radiation, plasma, or ultraviolet rays. Of the above, it is preferable to use the method of corona treating or plasma treating a surface of the base material, under atmosphere conditions ranging from a vacuum to atmospheric pressure.

Examples of a method of corona treating or plasma treating a surface of the base material include: a method of surface treating the base material by placing the base material between opposing electrodes and causing discharge of corona or plasma, under a pressure at or near atmospheric pressure; a method of (i) causing gas to flow between opposing electrodes, (ii) making the gas into plasma between the electrodes, and (iii) blowing the plasma gas onto the base material; and a method of surface treating the base material with glow discharge plasma generated under low pressure.

Of the above, it is preferable to use the method of surface treating the base material by placing the base material between opposing electrodes and causing discharge of corona or plasma, under a pressure at or near atmospheric pressure or the method of (i) causing gas to flow between opposing electrodes, (ii) making the gas into plasma between the electrodes, and (iii) blowing the plasma gas onto the base material. The corona treatment or plasma surface treatment is ordinarily carried out by using a commercially available surface treatment device.

The base material may have a protective film on a surface facing away from the surface on which the composition in accordance with an embodiment of the present invention is applied. Examples of the protective film include films made from such materials as polyethylene, polyethylene terephthalate, polycarbonate, and polyolefin, and a film made from such materials which further has an adhesive layer. Of such films, a film made from polyethylene terephthalate is preferable because it exhibits little thermal deformation during drying. Providing a protective film on a surface facing away from the surface on which the present composition is applied makes it possible to prevent film shaking and slight vibration of the coated surface during conveyance of the base material, thus improving uniformity of the coating film.

The base material preferably has a small thickness. This is because a base material which is thin has a small mass and thus can be handled practically. Note, however, that a base material whose thickness is excessively small tends to have less strength and inferior processability. The base material has a thickness ordinarily of 5 μm to 300 μm and preferably of 20 μm to 200 μm.

The base material has a length, as measured in the longitudinal direction, which is ordinarily 10 m to 3000 m and preferably 100 m to 2000 m. The base material has a width, as measured in the widthwise direction, which is ordinarily 0.1 m to 5 m and preferably 0.2 m to 2 m.

<Alignment Film>

The alignment film for the present invention is a film that has an alignment regulating force by which the polymerizable liquid crystal compound is subjected to alignment in a desired direction.

The alignment film preferably has (i) solvent resistance such that the alignment film is not dissolved by, for example, application of the composition in accordance with an embodiment of the present invention and (ii) heat resistance so as to withstand a heat treatment carried out to remove the solvent and align the polymerizable liquid crystal compound. Examples of the alignment film include an alignment film containing an alignment polymer, a photoalignment film, and a groove alignment film which achieves alignment by a pattern of depressions and protrusions or a plurality of grooves formed in its surface.

Examples of the alignment polymer include: polyamides or gelatins each of which has an amide bond in a molecule thereof; a polyimide which has an imide bond in a molecule thereof, polyamic acid which is a hydrolysate of the polyimide, polyvinyl alcohol, alkyl-modified polyvinyl alcohol, polyacrylamide, polyoxazole, polyethylenimine, polystyrene, polyvinylpyrrolidone, polyacrylic acid, and polyacrylic esters. Of the above, polyvinyl alcohol is preferable. Two or more alignment polymers may be used in combination.

An alignment film containing an alignment polymer is normally formed on a surface of a base material by applying, to the base material, a composition in which an alignment polymer is dissolved in a solvent (hereinafter also referred to as an alignment polymer composition), and removing the solvent, or by applying the alignment polymer composition to the base material, removing the solvent, and carrying out rubbing (a rubbing method).

Examples of the solvent include water; alcohol solvents such as methanol, ethanol, ethylene glycol, isopropyl alcohol, propylene glycol, methyl cellosolve, butyl cellosolve, and propylene glycol monomethyl ether; ester solvents such as ethyl acetate, butyl acetate, ethylene glycol methyl ether acetate, γ-butyrolactone, propylene glycol methyl ether acetate, and ethyl lactate; ketone solvents such as acetone, methyl ethyl ketone, cyclopentanone, cyclohexanone, methyl amyl ketone, and methyl isobutyl ketone; aliphatic hydrocarbon solvents such as pentane, hexane, and heptane; aromatic hydrocarbon solvents such as toluene and xylene; nitrile solvents such as acetonitrile; ether solvents such as tetrahydrofuran and dimethoxyethane; chlorinated hydrocarbon solvents such as chloroform and chlorobenzene; and the like. A single one of these solvents can be used alone, or two or more of these solvents can be used in combination.

The alignment polymer contained in the alignment polymer composition only needs to have a concentration falling within a range that allows material(s) of the alignment polymer to be completely dissolved in the solvent. The concentration is preferably 0.1 mass % to 20 mass %, and more preferably approximately 0.1 mass % to 10 mass % in solid content terms, relative to the solution.

A commercially available alignment film material may be used as-is as the alignment polymer composition. Examples of commercially available alignment film materials include SUNEVER (Registered Trademark) (manufactured by NISSAN CHEMICAL INDUSTRIES, LTD.) and OPTMER (Registered Trademark) (manufactured by JSR Corporation).

Known methods can be used for applying the alignment polymer composition to a base material. Such known methods include: application methods such as spin coating, extrusion, gravure coating, die coating, slit coating, bar coating, and an applicator method; and printing methods such as flexography. In a case where a polarizing film in accordance with an embodiment of the present invention is to be produced via a continuous roll-to-roll production method (described later), the method employed for applying the alignment polymer composition is ordinarily gravure coating, die coating, or a printing method such as flexography.

Examples of methods for removing the solvent contained in the alignment polymer composition include natural drying, draught drying, heat drying, and drying under reduced pressure.

The alignment film is subjected to rubbing (a rubbing method), as necessary, in order to give alignment regulating force to the alignment film. By selecting a direction of the rubbing, it is possible to discretionarily control a direction of the alignment regulating force.

Examples of methods for giving alignment regulating force via a rubbing method include a method in which an alignment polymer film, which has been formed on a surface of a base material by applying an alignment polymer composition to the base material and annealing the alignment polymer composition, is brought into contact with a rubbing roller which is wound with a rubbing cloth and is rotating.

A photoalignment film is normally formed on a surface of a base material by applying, to the base material, a composition containing (i) a photoreactive group-containing polymer or a photoreactive group-containing monomer and (ii) a solvent (such a composition is hereinafter sometimes referred to as a "composition for photoalignment film formation"), and irradiating, with light (preferably polarized UV light), the base material to which the composition has been applied. The photoalignment film is more preferable in that a direction of the alignment regulating force can be discretionarily controlled by selecting a polarization direction of light with which to irradiate the base material to which the composition has been applied.

A photoreactive group refers to a group that generates liquid crystal alignment power upon being irradiated with light. Specific examples of a photoreactive group include a group that contributes to a photoreaction in which liquid crystal alignment power originates, such as molecular alignment induction or a molecular isomerization reaction caused by light irradiation, a dimerization reaction caused by light irradiation, a photocrosslinking reaction caused by light irradiation, or a photolysis reaction caused by light irradiation. In particular, a group that contributes to a dimerization reaction or a photocrosslinking reaction is preferable in terms of excellence in alignment property. A group that has an unsaturated bond, particularly a double bond is preferable as a photoreactive group. A group that has at least one bond selected from the group consisting of a carbon-carbon double bond (C═C bond), a carbon-nitrogen double bond (C═N bond), a nitrogen-nitrogen double bond (N═N bond), and a carbon-oxygen double bond (C═O bond) is particularly preferable as a photoreactive group.

Examples of the photoreactive group having a C═C bond include a vinyl group, a polyene group, a stilbene group, a stilbazole group, a stilbazolium group, a chalcone group, a cinnamoyl group, and the like. Examples of the photoreactive group having a C═N bond include groups having structures such as aromatic Schiff base and aromatic hydrazone. Examples of the photoreactive group having an N═N bond include an azobenzene group, an azonaphtalene group, a heteroaromatic ring azo group, a bisazo group, a formazan group, and a group having an azoxybenzene structure. Examples of the photoreactive group having a C═O bond include a benzophenone group, a coumarin group, an anthraquinone group, and a maleimide group. These groups can have any of substituents such as an alkyl group, an alkoxy group, an aryl group, an allyloxy group, a cyano group, an alkoxycarbonyl group, a hydroxyl group, a sulfonic group, an alkyl halide group, and the like.

Among those, it is preferable to employ a photoreactive group which is involved in a photodimerization. The cinnamoyl group and the chalcone group are preferable because an amount of polarized radiation necessary for photoalignment is relatively small and a photoalignment film which is excellent in thermal stability and in temporal stability is more likely to be obtained. A polymer having a photoreactive group is particularly preferably a polymer having a cinnamoyl group in which a terminal of a polymer-side chain has a cinnamic acid structure.

Examples of a solvent to be contained in the composition for photoalignment film formation include solvents similar to those to be included in the alignment polymer composition. The solvent can be selected as necessary in accordance with a solubility of the photoreactive group-containing polymer or photoreactive group-containing monomer.

The photoreactive group-containing polymer or photoreactive group-containing monomer is contained in the composition for photoalignment film formation in an amount which can be adjusted as necessary in accordance with, for example, (i) the type of polymer or monomer and (ii) a desired thickness of the photoalignment film. The amount is, however, preferably at least 0.2% by mass and more preferably 0.3% by mass to 10% by mass. The composition for photoalignment film formation can contain polymeric materials such as polyvinyl alcohol and polyimide, and/or a photosensitizer, provided that a characteristic of the photoalignment film is not greatly impaired.

A method for applying the composition for photoalignment film formation to a base material can be a method similar to the method for applying the alignment polymer composition to a base material. A method for removing the solvent from the composition for photoalignment film formation can be, for example, a method identical to the method for removing the solvent from the alignment polymer composition.

Polarized light irradiation can be carried out in a mode in which polarized UV light is irradiated directly onto a composition obtained by removing the solvent from the composition for photoalignment film formation, the composition having been applied to the base material, or in a mode in which the composition is irradiated with polarized light that is incident on the base material and then is transmitted through the base material. The polarized light is particularly preferably substantially parallel light. Polarized light with which to irradiate the composition need only have a wavelength in a wavelength region in which a photoreactive group of the photoreactive group-containing polymer or the photoreactive group-containing monomer can absorb light energy. Specifically, the polarized light with which to irradiate the composition is particularly preferably UV (ultraviolet ray) having a wavelength in a range of 250 nm to 400 nm. Examples of a light source that is used in the polarized radiation include a xenon lamp, a high pressure mercury lamp, an extra-high pressure mercury lamp, a metal halide lamp, and an ultraviolet light lasers such as KrF or ArF lasers. Out of these examples, a high pressure mercury lamp, an extra-high pressure mercury lamp, or a metal halide lamp is more preferably used. These lamps are preferable because they achieve a high light emission intensity in emitting an ultraviolet ray at a wavelength of 313 nm. By causing the light source to emit light so that the light passes through an appropriate polarizer, it is possible to emit polarized UV light. Examples of the polarizer include: a polarizing filter; polarizing prisms such as a Glan-Thompson prism and a Glan-Taylor prism; and a wire grid type polarizer.

Note that, in a case where masking is carried out during rubbing or polarized light irradiation, it is possible to form a plurality of regions (patterns) that differ in direction of liquid crystal alignment.

A groove alignment film is a film which achieves liquid crystal alignment by a pattern of depressions and protrusions or a plurality of grooves formed in its surface H. V. Kennel et al. have reported the fact that in a case where liquid crystal molecules are placed on a base material having a plurality of evenly-spaced linear grooves, the liquid crystal molecules become aligned along the direction of the grooves ((Physical Review A24 (5) p. 2713, 1981).

Specific examples of methods for forming a groove alignment film on a surface of a base material include: a method of forming a pattern of depressions and protrusions by (i) exposing a surface of a photosensitive polyimide to light through an exposure mask having a repeating pattern of slits and (ii) thereafter, removing unnecessary polyimide film by carrying out development and a rinse treatment; a method involving (i) forming a UV curable resin layer on a plate-like matrix whose surface is provided with grooves, (ii) transferring the resin layer to a base material film, and then (iii) curing the resin layer; and a method involving (i) conveying a base material film on which a UV curable resin layer has been formed, (ii) pressing a roll-like matrix having a plurality of grooves onto a surface of the UV curable resin layer so as to form depressions and protrusions, and (iii) subsequently curing the resin layer. For example, the methods disclosed in Japanese Patent Application Publication, Tokukaihei, No. 6-34976 and Japanese Patent Application Publication, Tokukai, No. 2011-242743 may be used.

Of the above methods, it is preferable to use the method involving pressing the roll-like matrix having a plurality of grooves onto the surface of the UV curable resin layer so as to form depressions and protrusions and subsequently curing the resin layer. In terms of durability, stainless steel (SUS) can be used for the roll-like matrix.

For the UV curable resin, it is possible to use a polymer of a monofunctional acrylate, a polymer of a multifunctional acrylate, or a polymer of a mixture of both a monofunctional acrylate and a multifunctional acrylate.

A monofunctional acrylate is a compound which has, in a molecule thereof, one group selected from the group consisting of an acryloyloxy group ($CH_2=CH-COO-$) and a methacryloyloxy group ($CH_2=C(CH_3)-COO-$). Such a group selected from the group consisting of an acryloyloxy group and a methacryloyloxy group is hereinafter also referred to as (meth)acryloyloxy group.

Examples of the monofunctional acrylate having one (meth)acryloyloxy group include an alkyl(meth)acrylate having 4 to 16 carbon atoms, a β-carboxyalkyl (meth)acrylate having to 14 carbon atoms, an alkylated phenyl (meth)acrylate having 2 to 14 carbon atoms, methoxypolyethyleneglycol (meth)acrylate, phenoxy polyethylene glycol (meth)acrylate, and isobornyl (meth)acrylate.

A multifunctional acrylate is, ordinarily, a compound having two to six (meth)acryloyloxy groups in a molecule thereof.

Examples of a bifunctional acrylate having two (meth)acryloyloxy groups include 1,3-butanediol di(meth)acrylate, 1,3-butanediol (meth)acrylate, 1,6-hexanediol di(meth)acrylate, ethylene glycol di(meth)acrylate, diethylene glycol di(meth)acrylate, neopentyl glycol di(meth)acrylate, triethylene glycol di(meth)acrylate, tetraethylene glycol di(meth)acrylate, polyethylene glycol diacrylate, bis(acryloyloxyethyl) ether of bisphenol A, ethoxylated bisphenol A di(meth)acrylate, propoxylated neopentyl glycol di(meth) acrylate, ethoxylated neopentyl glycol di(meth)acrylate, and 3-methyl pentanediol di(meth)acrylate.

Examples of a multifunctional acrylate having three to six (meth)acryloyloxy groups include:
trimethylolpropane tri(meth)acrylate, pentaerythritol tri(meth)acrylate, tris(2-hydroxyethyl) isocyanurate tri(meth)acrylate, ethoxylated trimethylolpropane tri(meth)acrylate, propoxylated trimethylolpropane tri(meth)acrylate, pentaerythritol tetra(meth)acrylate, dipentaerythritol penta(meth)acrylate, dipentaerythritol hexa(meth)acrylate, tripentaerythritol tetra(meth)acrylate, tripentaerythritol penta(meth)acrylate, tripentaerythritol hexa(meth)acrylate, tripentaerythritol hepta(meth)acrylate, tripentaerythritol octa(meth)acrylate;
a product of reacting pentaerythritol tri(meth)acrylate and an acid anhydride, a product of reacting dipentaerythritol penta (meth)acrylate and an acid anhydride, a product of reacting tripentaerythritol hepta(meth)acrylate and an acid anhydride;
caprolactone-modified trimethylolpropane tri(meth)acrylate, caprolactone-modified pentaerythritol tri(meth)acrylate, caprolactone-modified tris(2-hydroxyethyl) isocyanurate tri(meth)acrylate, caprolactone-modified pentaerythritol tetra(meth)acrylate, caprolactone-modified dipentaerythritol penta(meth)acrylate, caprolactone-modified dipentaerythritol hexa(meth)acrylate, caprolactone-modified tripentaerythritol tetra(meth)acrylate, caprolactone-modified tripentaerythritol penta(meth)acrylate, caprolactone-modified tripentaerythritol hexa(meth)acrylate, caprolactone-modified tripentaerythritol hepta(meth)acrylate, caprolactone-modified tripentaerythritol octa(meth)acrylate;
a product of reacting caprolactone-modified pentaerythritol tri(meth)acrylate and an acid anhydride, a product of reacting caprolactone-modified dipentaerythritol penta(meth)acrylate and an acid anhydride, and a product of reacting caprolactone-modified tripentaerythritol hepta(meth)acrylate and an acid anhydride.

Note that in the specific examples of multifunctional acrylate indicated here, "(meth)acrylate" means "acrylate or methacrylate." Furthermore, "caprolactone-modified" means that ring-opened caprolactone or a ring-opened polymer of caprolactone has been introduced between an alcohol-derived portion and a (meth)acryloyloxy group of a (meth)acrylate compound.

A commercial product can be used as the multifunctional acrylate. Examples of such a commercial product include A-DOD-N, A-HD-N, A-NOD-N, APG-100, APG-200, APG-400, A-GLY-9E, A-GLY-20E, A-TMM-3, A-TMPT, AD-TMP, ATM-35E, A-TMMT, A-9550, A-DPH, HD-N, NOD-N, NPG and TMPT (manufactured by Shin-Nakamura Chemical Co., Ltd.); "ARONIX M-220", "ARONIX M-325", "ARONIX M-240", "ARONIX M-270", "ARONIX M-309", "ARONIX M-310", "ARONIX M-321", "ARONIX M-350", "ARONIX M-360", "ARONIX M-305", "ARONIX M-306", "ARONIX M-450", "ARONIX M-451", "ARONIX M-408", "ARONIX M-400", "ARONIX M-402", "ARONIX M-403", "ARONIX M-404", "ARONIX M-405", and "ARONIX M-406" (manufactured by Toagosei Co., Ltd.); and "EBECRYL 11", "EBECRYL 145", "EBECRYL 150", "EBECRYL 40", "EBECRYL 140", "EBECRYL 180", DPGDA, HDDA, TPGDA, HPNDA, PETIA, PETRA, TMPTA, TMPEOTA, DPHA, and EBECRYL series (manufactured by Daicel-Cytec Co., Ltd.).

With regards to the depressions and protrusions in the groove alignment film, a protrusion has a width of preferably 0.05 μm to 5 μm, and a depression has a width of preferably 0.1 µm to 5 µm. A difference in depth between a depression and protrusion is preferably 2 µm or less and more preferably 0.01 µm to 1 µm. Such a range makes it possible to obtain a liquid crystal alignment with little alignment disorder.

The alignment film has a thickness which is ordinarily 10 nm to 10000 nm, preferably 10 nm to 1000 nm, and more preferably 10 nm to 500 nm.

A method for applying the composition in accordance with an embodiment of the present invention can be a method similar to the example methods indicated for applying the alignment polymer composition to a base material.

<Step (B)>

In a case where the composition in accordance with an embodiment of the present invention contains a solvent, the solvent is ordinarily removed from a coated film which has been formed. Examples of methods for removing the solvent include natural drying, draught drying, heat drying, and drying under reduced pressure.

The polymerizable liquid crystal compound contained in the coated film which has been formed is ordinarily heated to a temperature equal to or greater than a temperature at which the compound becomes a solution, and is then cooled to a temperature at which liquid crystal alignment occurs, so as to align the compound and form a liquid crystal phase.

The temperature for aligning the polymerizable liquid crystal compound contained in the coated film which has been formed can be found in advance by, for example, texture observations using a composition containing the polymerizable liquid crystal compound. The solvent removal and the liquid crystal alignment can be carried out simultaneously. The temperature to be used in such a case will depend on the type of solvent to be removed and the type of the polymerizable liquid crystal compound, but is preferably in a range of 50° C. to 200° C. In a case where the base material is a resin base material, the temperature is more preferably in a range of 80° C. to 130° C.

In a case where the circularly polarizing plate is produced so as to include (i) a base material which is a quarter-wave plate and (ii) the polarizing film in accordance with an embodiment of the present invention, an alignment direction of the polymerizable liquid crystal compound can be set such that a substantially 45° angle is formed by the transmission axis of the polarizing film to be produced and a slow axis (light axis) of the base material.

<Step (C)>

The polymerizable liquid crystal compound, having been aligned, is polymerized by irradiating the polymerizable liquid crystal compound with an active energy ray.

Polymerizing the polymerizable liquid crystal compound having been aligned makes it possible to obtain a polarizing film including (i) a polymerizable liquid crystal compound which has been polymerized in an aligned state and (ii) a compound (1) having been aligned with the polymerizable liquid crystal compound.

A polarizing film containing a polymerizable liquid crystal compound which has been polymerized while retaining a smectic liquid crystal phase has (i) high polarizability in comparison to a conventional host-guest type polarizing film (i.e., a polarizing film in which, for example, a polymerizable liquid crystal compound has been polymerized while retaining a nematic liquid crystal phase) and (ii) superior polarizability and strength in comparison to a polarizing film obtained by applying only a dichroic pigment or lyotropic liquid crystal-type liquid crystal compound.

A light source for the active energy ray need only be a light source which generates ultraviolet rays, electron beams, X-rays, or the like. The light source is preferably one which has a light emission distribution such that wavelength is 400 nm or less, such as low pressure mercury lamp, medium pressure mercury lamp, high pressure mercury lamp, super-high pressure mercury lamp, chemical lamp, black light lamp, microwave excitation mercury lamp, or metal halide lamp.

The irradiation energy of the active energy ray is set such that a wavelength region effective for activation of the polymerization initiator has an irradiation intensity of preferably 10 mJ/cm$^2$ to 5000 mJ/cm$^2$, and more preferably 100 mJ/cm$^2$ to 2000 mJ/cm$^2$. A irradiation energy of less than 10 mJ/cm$^2$ tends to result in insufficient curing of the polymerizable liquid crystal compound.

The polarizing film, in accordance with an embodiment of the present invention, having been formed thusly, has a thickness that is preferably in a range of 0.5 µm to 10 µm, and more preferably in a range of 1 µm to 5 µm. The thickness of the polarizing film in accordance with an embodiment of the present invention can be found by measurements using an interference thickness meter, a laser microscope, or stylus type thickness meter.

The polarizing film in accordance with an embodiment of the present invention is particularly preferably one in which a Bragg peak can be obtained in X-ray diffraction measurement. Examples of such a polarizing film in accordance with an embodiment of the present invention in which a Bragg peak can be obtained include a polarizing film which exhibits a diffraction peak derived from a hexatic phase or crystal phase.

A maximum absorption ($\lambda_{max1}$) of the polarizing film in accordance with an embodiment of the present invention preferably falls within a range of 350 nm to 550 nm, more preferably falls within a range of 410 nm to 540 nm, and even more preferably falls within a range of 430 nm to 530 nm. The $\lambda_{max1}$ is preferably shifted to a longer wavelength in comparison to a maximum absorption ($\lambda_{max2}$) measured in a case where the compound (1) contained in the polarizing film in accordance with an embodiment of the present invention has been dissolved in a suitable solvent. The shift to a longer wavelength is exhibited when the compound (1) is dispersed between molecular chains formed by the polymerizable liquid crystal compound which has been polymerized. The shift indicates strong interaction between the compound (1) and the molecular chain. "Shift to a longer wavelength" means that a difference between absorption maxima ($\lambda_{max1}$-$\lambda_{max2}$) becomes a positive value. The difference is preferably 10 nm or more and is more preferably 30 nm or more.

The polarizing film in accordance with an embodiment of the present invention exhibits a dichroic ratio which is preferably 50 or more.

In a case where the base material that is used is not a quarter-wave plate, it is possible to obtain the circularly polarizing plate by laminating (i) the obtained polarizing film in accordance with an embodiment of the present invention and (ii) a quarter-wave plate to each other. In such a case, it is preferable to dispose the polarizing film in accordance with an embodiment of the present invention and the quarter-wave plate in a manner such that a transmission axis of the polarizing film and a slow axis (light axis) of the quarter-wave plate form an angle that is substantially 45°. It is also possible to obtain a circularly polarizing plate which functions as an optical compensation film by causing (i) the transmission axis of the polarizing film in accordance with an embodiment of the present invention and (ii) the light axis of a phase-difference film such as a quarter-wave plate to be aligned or to intersect orthogonally.

The polarizing film in accordance with an embodiment of the present invention and the quarter-wave plate can be laminated to each other along with a base material on which the polarizing film has been formed or a base material on which an alignment film has been formed. The polarizing film and the quarter-wave plate can alternatively be laminated to each other after the base material, or base material and alignment film, has/have been removed. Laminating (i) the polarizing film in accordance with an embodiment of the present invention, which has been formed on a base material or on a base material on which an alignment film has been formed and (ii) the quarter-wave plate to each other can be carried out by, for example, using an adhesive to bond the quarter-wave plate to a surface on which the polarizing film has been formed, and then subsequently removing the base material or the base material on which the alignment film has been formed. In such a case, the adhesive may be applied to the polarizing film and/or to the quarter-wave plate.

<Method for Continuously Producing Polarizing Film in Accordance with Embodiment of Present Invention>

A polarizing film in accordance with an embodiment of the present invention is preferably produced by continuous roll-to-roll production. The following description will discuss, with reference to FIG. 1, main parts of a method continuous roll-to-roll production for the polarizing film in accordance with an embodiment of the present invention.

A first roll 210, in which a base material has been wound onto a first core 210A, can be easily obtained, for example, as a commercial product. Examples of such commercially available base materials in roll form include, among the example base materials already discussed above, films made from cellulose ester, cyclic olefinic resin, polycarbonate, polyethylene terephthalate or polymethacrylic acid ester.

A base material P is wound off from the first roll 210. The base material P can be wound off by a method in which a suitable rotation means is provided to the core 210A of the first roll 210 and causes the first roll 210 to rotate. The base material P can alternatively be wound off by a method in which at least one suitable auxiliary roll 300 is provided in a direction in which the base material P is conveyed from the first roll 210, and a rotation means of the auxiliary roll 300 is used to wind off the base material P. The base material P can alternatively be wound off by a method in which respective rotation means are provided to the first core 210A and to the auxiliary roll 300 so as to wind off the base material P while suitably tensioning the base material P.

After the base material P is wound off from the first roll 210, a coating device 211A applies a composition for photoalignment film formation to the base material P as the base material P passes through the coating device 211A. Preferable methods for continuously applying the composition for photoalignment film formation via the coating device 211A are gravure coating, die coating, and flexography.

After passing through the coating device 211A, the base material P is conveyed to a drying furnace 212A. The drying furnace 212A dries the composition for photoalignment film formation, thereby continuously forming a first coated film on a surface of the base material. Examples of the drying furnace 212A include a hot air type drying furnace which combines draught drying and heat drying. A temperature to which the drying furnace 212A is set is determined in accordance with, for example, the type of the solvent contained in the composition for photoalignment film formation. The drying furnace 212A can be configured to include a plurality of zones each set to differing temperatures, or configured to include a plurality of drying furnaces which are provided in a linear manner and are each set to differing temperatures.

Next, a polarized UV light irradiation device 213A irradiates the obtained first coated film with polarized UV light so that a photoalignment film is obtained.

Thereafter, the base material P having the photoalignment film formed thereon passes through a coating device 211B. The coating device 211B applies, to the photoalignment film, the composition in accordance with an embodiment of the present invention, which composition contains a solvent. Thereafter, the base material P passes through a drying furnace 212B, so that a second coated film is obtained. In the second coated film, the polymerizable liquid crystal compound contained in the composition in accordance with an embodiment of the present invention is aligned. The drying furnace 212B serves a role of removing the solvent contained in the composition in accordance with an embodiment of the present invention, after composition has been applied onto the photoalignment film. The drying furnace 212B also serves a role of providing thermal energy so that the polymerizable liquid crystal compound contained in the composition becomes aligned. Similarly to the drying furnace 212A, the drying furnace 212B can be configured to include a plurality of zones each set to differing temperatures, or configured to include a plurality of drying furnaces which are provided in a linear manner and are each set to differing temperatures.

The base material P is conveyed to an active energy ray irradiation device 213B in a state where the polymerizable liquid crystal compound contained in the second coated film is aligned. The active energy ray irradiation device 213B irradiates the second coated film with active energy rays. This irradiation causes polymerization in a state where the polymerizable liquid crystal compound is aligned, so that a polarizing film is obtained.

The polarizing film in accordance with an embodiment of the present invention, having been thusly continuously produced, is wound around a second core 220A so as to be in the form of a second roll 220. The polarizing film may be wound together with a suitable spacer.

Thus, the polarizing film in accordance with an embodiment of the present invention can be produced in a continuous roll-to-roll manner by conveying the base material P from the first roll 210 through the coating device 211A, the drying furnace 212A, the polarized UV light irradiation device 213A, the coating device 211B, the drying furnace 212B and the active energy ray irradiation device 213B, in this order.

The producing apparatus of FIG. 1 illustrates an example method in which the polarizing film in accordance with an embodiment of the present invention is produced continuously. It is also possible, however, to produce the polarizing film in accordance with an embodiment of the present invention by a method in which, for example, (i) the base material P is conveyed from the first roll 210 through the coating device 211A, the drying furnace 212A, and the polarized UV light irradiation device 213A in this order, (ii) thereafter, the base material and the photoalignment film are wrapped around a core to produce a laminated body in the form of a roll, and then (iii) the laminated body is unwound and passed through the coating device 211B and drying furnace 212B, and the active energy ray irradiation device 213B in this order.

In a case where the polarizing film in accordance with an embodiment of the present invention is produced in the form of the second roll 220, a circularly polarizing plate can be produced by (i) winding off the polarizing film, which is long, from the second roll 220, (ii) cutting the polarizing film to a predetermined dimension, and (iii) bonding a quarter-wave plate to the polarizing film thus cut. Alternatively, a long circularly polarizing plate can be produced continuously by preparing a third roll (not shown) obtained by winding a long quarter-wave plate onto a core.

Figure 2:
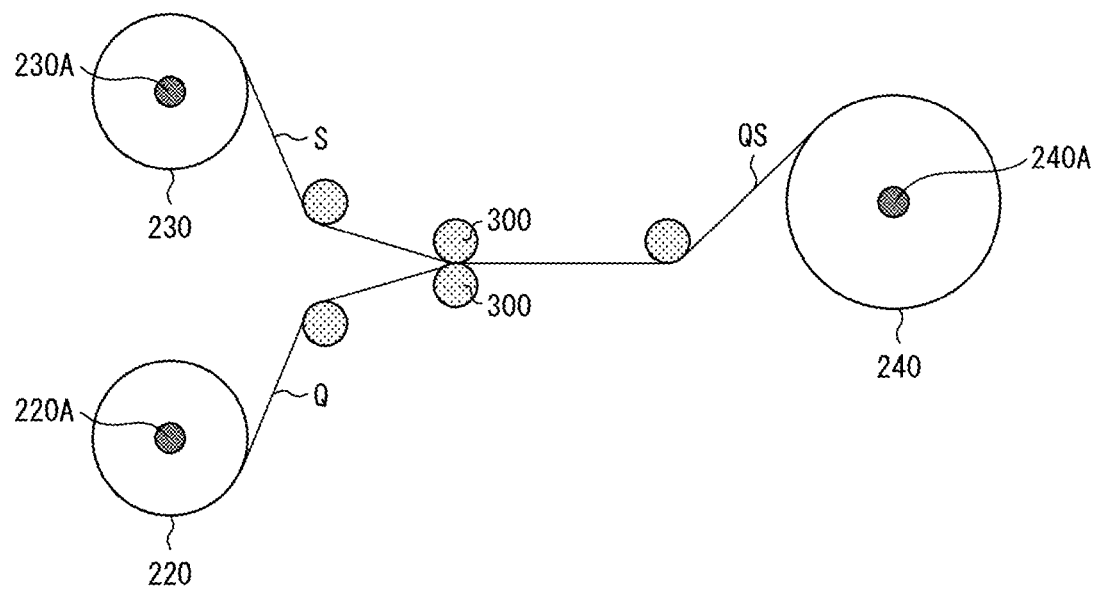
FIG. 2 is a front view schematically illustrating a producing apparatus which continuously produces circularly polarizing plates having respective polarizing films in accordance with an embodiment of the present invention.

The following description will discuss, with reference to the producing apparatus illustrated in FIG. 2, an example method for continuously producing a long circularly polarizing plate. The method includes the steps of (i) continuously winding off a polarizing film Q in accordance with an embodiment of the present invention from the second roll 220 wound around the second core 220A and concurrently continuously winding off a long quarter-wave plate S from a third roll 230 obtained by winding a long quarter-wave plate onto a third core 230A, (ii) obtaining a long circularly polarizing plate QS by continuously bonding the polarizing film Q and the long quarter-wave plate S to each other, and (iii) obtaining a fourth roll 240 by winding the long circularly polarizing plate QS thus obtained onto a fourth core 240A.

The polarizing film Q and the quarter-wave plate S can be wound off by using a method in which suitable respective rotation means are provided to the core 220A of the second roll 220 and the core 230A of the third roll 230, and the respective rotation means cause the second roll 220 and the third roll 230 to rotate. The polarizing film Q and the quarter-wave plate S can alternatively be wound off by a method in which at least one suitable auxiliary roll 300 is provided in a direction in which the polarizing film Q and the quarter-wave plate S are conveyed, and a rotation means of the auxiliary roll 300 is used to wind off the polarizing film Q and the quarter-wave plate S. The polarizing film Q and the quarter-wave plate S can alternatively be wound off by a method in which respective rotation means are provided to the core 220A, the core 230A, and the auxiliary roll 300 so as to wind off the polarizing film Q and the quarter-wave plate S while suitably tensioning the polarizing film Q and the quarter-wave plate S. Such methods are known as roll-to-roll bonding. Note that an adhesive may be used for the bonding.

<Application of polarizing film in accordance with embodiment of present invention>

A polarizing film in accordance with an embodiment of the present invention and a circularly polarizing plate including the polarizing film and a quarter-wave plate can be used for various display devices.

A display device is a device including: a display element; and a light-emitting element or a light-emitting device serving as a light-emitting source. Examples of the display device including the polarizing film in accordance with an embodiment of the present invention encompass a liquid crystal display device, an organic electroluminescent (EL) display device, an inorganic electroluminescent (EL) display device, an electron emission display device (e.g. a field emission display device (FED), a surface-conduction electron-emitter display device (SED)), electronic paper (a display device which employs electronic ink or an electrophoretic element), a plasma display device, projection display devices (e.g. a grating light valve (GLV) display device and a display device including a digital micromirror device (DMD)), and a piezoelectric ceramic display. Examples of the liquid crystal display device encompass: a transmissive liquid crystal display device, a semi-transmissive liquid crystal display device, a reflective liquid crystal display device, a direct-view liquid crystal display device, and a projection liquid crystal display device. Each of those display devices can be a display device which displays a two-dimensional image or can be a stereoscopic display device which displays a three-dimensional image.

The polarizing film in accordance with an embodiment of the present invention can be used particularly effectively for a liquid crystal display device, an organic electroluminescent (EL) display device, and an inorganic electroluminescent (EL) display device. The organic EL display device includes at least: the polarizing film in accordance with an embodiment of the present invention; and an organic EL element. The organic EL element can be an element having a publicly known configuration.

The circularly polarizing plate including the polarizing film in accordance with an embodiment of the present invention and a quarter-wave plate can be used particularly effectively for an organic electroluminescent (EL) display device and an inorganic electroluminescent (EL) display device. The organic EL display device includes at least: a circularly polarizing plate in accordance with an embodiment of the present invention; and an organic EL element.

In a case where the polarizing film in accordance with an embodiment of the present invention is used for a liquid crystal display device, the polarizing film can be provided outside or inside a liquid crystal cell. The liquid crystal cell includes at least: the polarizing film in accordance with an embodiment of the present invention; a liquid crystal layer; and a base.

Figure 3:
FIG. 3 is a side view schematically illustrating a configuration of a display device including a polarizing film in accordance with an embodiment of the present invention.

The following description will discuss, with reference to FIG. 3, a first configuration of particularly a transmissive active-matrix color liquid crystal display device in a case where a polarizing film in accordance with an embodiment of the present invention is provided inside a liquid crystal cell of the display device. The display device 30 is configured so that a first base 31, a first polarizing film 32 in accordance with an embodiment of the present invention, a color filter layer (color filter) 33, a planarizing layer 34, an ITO electrode layer 35, a first alignment film 36, a liquid crystal layer 37, a second alignment film 38, a second polarizing film 39 in accordance with an embodiment of the present invention, a TFT layer 40 including a thin film transistor circuit and a pixel electrode, and a second base 41 are laminated in this order. These layers can be laminated by a publicly known method.

The first polarizing film 32 in accordance with an embodiment of the present invention is provided between the first base 31 and the liquid crystal layer 37.

The color filter layer 33 is provided between the first base 31 and the liquid crystal layer 37 so as to take out, from light entering the display device from a first base 31-side, light having a desired wavelength. The color filter layer 33 can be, for example, (i) a layer which absorbs, from white light, a light having any wavelength other than a desired wavelength, so as to allow only light having the desired wavelength to pass through the layer or (ii) a layer which converts a wavelength of light, which has entered the display device, so as to emit light having a desired wavelength.

The first polarizing film 32 in accordance with an embodiment of the present invention can include an alignment film on a first base 31-side thereof. The second polarizing film 39 in accordance with an embodiment of the present invention can include an alignment film on a second base 41-side thereof. Each of the first alignment film 36 and the second alignment film 38 can be a rubbed alignment film or a photo-alignment film. The first polarizing film 32 in accordance with an embodiment of the present invention can include a phase-difference layer.

Figure 4:
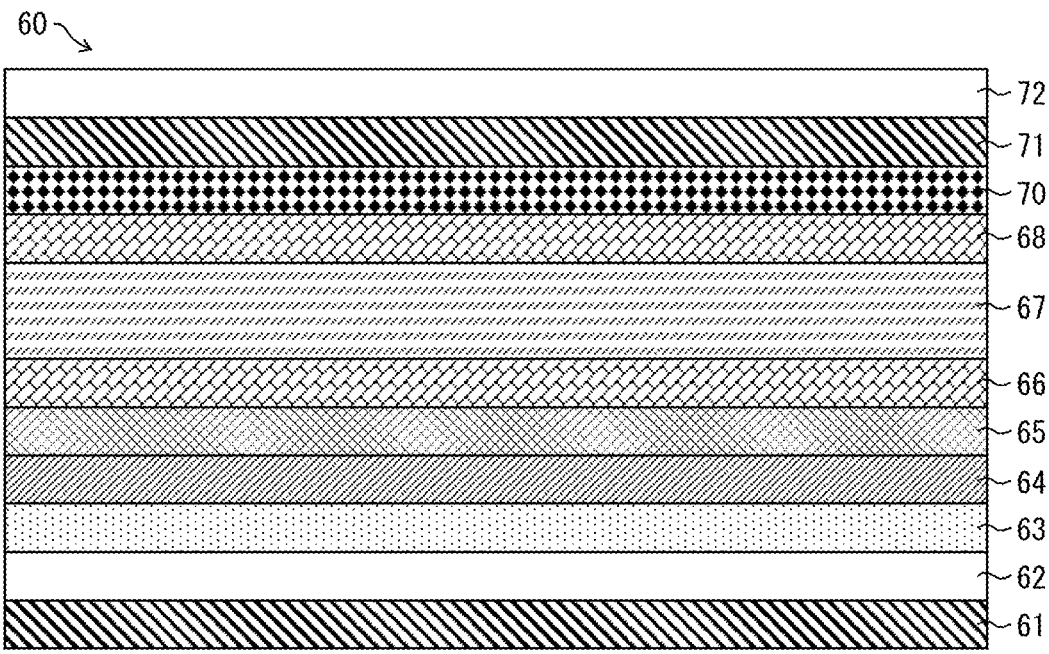
FIG. 4 is a side view schematically illustrating another configuration of a display device including a polarizing film in accordance with an embodiment of the present invention.

A second configuration of the display device will be described next with reference to FIG. 4. A display device 60 is configured so that a first base 61, a first polarizing film 62 in accordance with an embodiment of the present invention, a color filter layer (color filter) 63, a planarizing layer 64, an ITO electrode layer 65, a first alignment film 66, a liquid crystal layer 67, a second alignment film 68, a TFT layer 70 including a thin film transistor circuit and a pixel electrode, a second base 71, and a second polarizing film 72 are laminated in this order. These layers can be laminated by a publicly known method.

The second polarizing film 72, which is located so as to face the TFT layer 70 via the second base 71, can be (i) a polarizing film in accordance with an embodiment of the present invention or (ii) a polarizing film which is produced by dyeing polyvinyl alcohol with iodine and then stretching the polyvinyl alcohol thus dyed.

Figure 5:
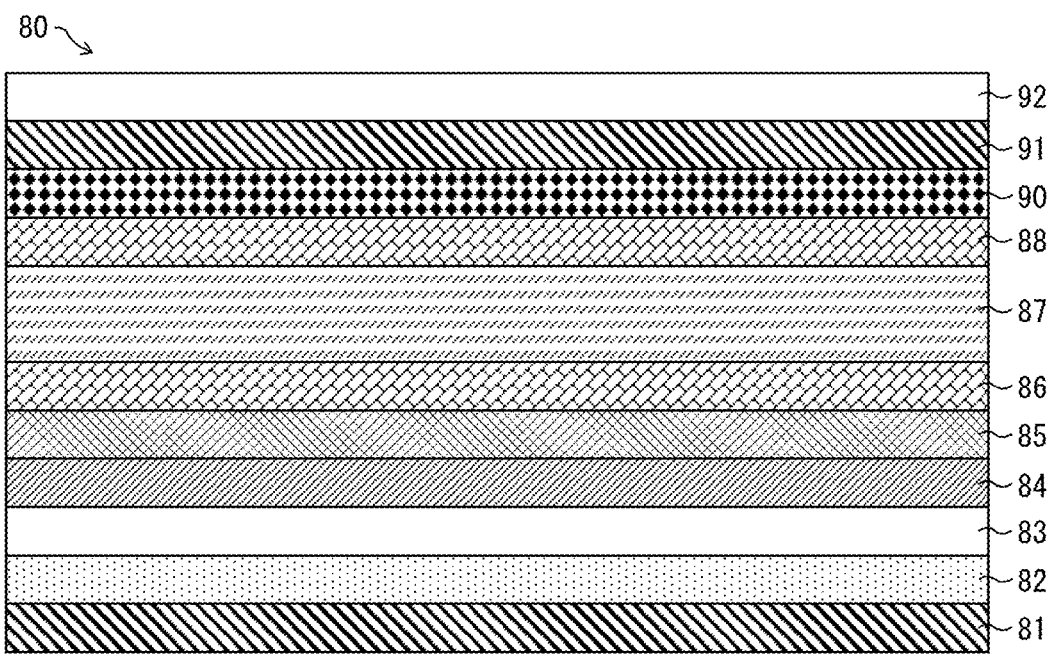
FIG. 5 is a side view schematically illustrating yet another configuration of a display device including a polarizing film in accordance with an embodiment of the present invention.

A third configuration of the display device will be described next with reference to FIG. 5. A display device 80 is configured so that a first base 81, a color filter layer (color filter) 82, a first polarizing film 83 in accordance with an embodiment of the present invention, a planarizing layer 84, an ITO electrode layer 85, a first alignment film 86, a liquid crystal layer 87, a second alignment film 88, a TFT layer 90 including a thin film transistor circuit and a pixel electrode, a second base 91, and a second polarizing film 92 are laminated in this order. These layers can be laminated by a publicly known method.

In the third configuration, the second polarizing film can be (i) a polarizing film in accordance with an embodiment of the present invention or (ii) a polarizing film which is produced by dyeing polyvinyl alcohol with iodine and then stretching the polyvinyl alcohol thus dyed. In a case where the second polarizing film 92 is a polarizing film in accordance with an embodiment of the present invention, the second polarizing film 92 can be located between the second base 91 and the TFT layer 90 as in the first configuration.

In the third configuration, the color filter layer 82 can be provided so that the first base 81 is located between the color filter layer 82 and the liquid crystal layer 87.

Note that there is a possibility that particles, which are contained in the color filter layer, cause polarized light to be scattered, so that the polarized light become depolarized. Therefore, among the first configuration to the third configuration, the third configuration, in which the first polarizing film in accordance with an embodiment of the present invention is located closer to the liquid crystal layer than is the color filter layer, is preferable. That is, a display device having the third configuration is preferable.

The present invention is not limited to the embodiments described above, but can be altered by a skilled person in the art within the scope of the claims. An embodiment derived from a proper combination of technical means each disclosed in a different embodiment is also encompassed in the technical scope of the present invention.

It is also possible to form a new technical feature by combining the technical means disclosed in the respective embodiments.

EXAMPLES

The following description will discuss the present invention in more detail with reference to Examples. However, the present invention should not be limited to the Examples below. Note that expressions "%" and "parts" in Examples refer to "% by mass" and "parts by mass", respectively, unless particularly stated otherwise.

Example 1

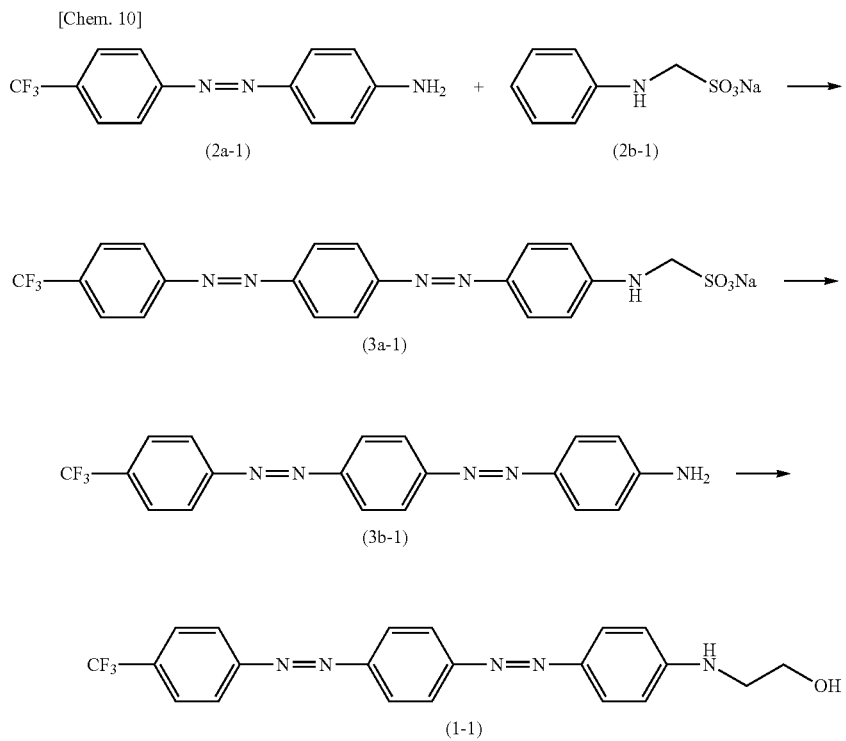

5.0 g of a compound represented by Formula (2a-1), 50 g of acetic acid, 5.0 g of water, and 6.50 g of 35% hydrochloric acid were mixed. A resultant mixture was cooled to 0° C., and then 4.5 g of 33% aqueous sodium nitrite solution was dropped. A resultant mixture was stirred for 30 minutes, and 0.03 g of amidosulfonic acid was added. A resultant mixture was dropped at 0° C. on a mixture of (i) 4.5 g of a compound represented by Formula (2b-1), (ii) 6.5 g of sodium acetate, and (iii) 68 g of water. Then, a deposit containing a compound represented by Formula (3a-1) was filtered, and was washed with water 3 times.

To a resultant deposit, 7.0 g of sodium hydroxide and 80 g of water were added. A resultant mixture was stirred at 85° C. for 2 hours, and was then cooled to 10° C. A resultant deposit was filtered, and was washed with water. A resultant solid substance was dried, so that 5.78 g of an orange solid substance represented by Formula (3b-1) was obtained.

0.50 g of the orange solid substance thus obtained, 0.88 g of N,N-diisopropylethylamine, and 5.0 g of N,N-dimethylacetamide were mixed, and then 1.2 g of 2-iodoethanol was dropped. A resultant mixture was stirred at 120° C. for 2 hours. A resultant reaction mixture was dropped on methanol, and then a deposit was filtered. A resultant solid substance was purified by silica gel column chromatography (eluate: chloroform). A resultant solid substance was washed with methanol and then dried, so that 0.102 g of a compound, which is an orange solid substance and is represented by Formula (1-1) (hereinafter referred to as "compound (1-1)"), was obtained. Characteristics and the like of a resultant compound are shown below.

Yield: (based on the compound represented by Formula (2a-1)): 15%

M/Z=414 (EI-MS)

Maximum absorption wavelength ($\lambda_{max2}$)=448 nm (chloroform solution).

Example 2

0.50 g of the compound (3b-1) which was the orange solid substance obtained in Example 1, 0.88 g of N,N-diisopropylethylamine, and 5.0 g of N,N-dimethylacetamide were mixed, and then 1.2 g of 2-iodoethanol was dropped. A resultant mixture was stirred at 120° C. for 2 hours. A resultant reaction mixture was dropped on methanol, and then a deposit was filtered. A resultant solid substance was purified by silica gel column chromatography (eluate: chloroform). A resultant solid substance was washed with methanol and then dried, so that 0.128 g of a compound, which is an orange solid substance and is represented by Formula (1-16) (hereinafter referred to as "compound (1-16)"), was obtained.

Yield: (based on the compound represented by Formula (2a-1)): 19%

M/Z=428 (EI-MS)

Maximum absorption wavelength ($\lambda_{max2}$)=458 nm (chloroform solution).

[Polymerizable liquid crystal compound]

The following compounds were used: a compound represented by the following Formula (4-6) (hereinafter referred to as "compound (4-6)"); a compound represented by the following Formula (4-8) (hereinafter referred to as "compound (4-8)"); a compound represented by the following Formula (4-22) (hereinafter referred to as "compound (4-22)"); and a compound represented by the following Formula (4-25) (hereinafter referred to as "compound (4-25)").

Note that the compound (4-6) was synthesized by the method disclosed in Lub et al. Recl. Tray. Chim. Pays-Bas, 115, 321-328 (1996). The compound (4-8) was also produced in conformity with this method.

The compound (4-22) and the compound (4-25) were each produced in conformity with the method disclosed in Japanese Patent No. 4719156.

Structural formulas of the compounds (4-6), (4-8), (4-22), and (4-25) are as follows:

[Chem. 11]

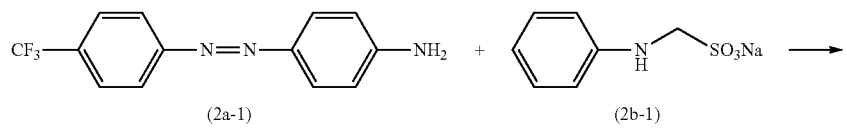
(2a-1) (2b-1)

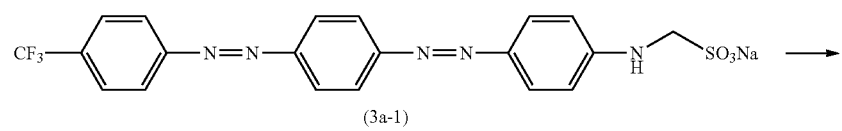
(3a-1)

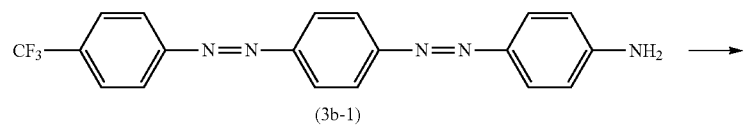
(3b-1)

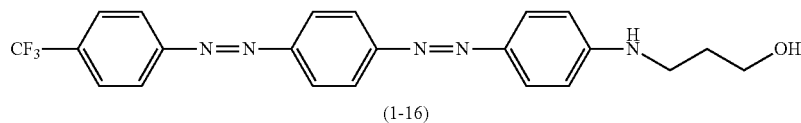
(1-16)

[Chem. 12]

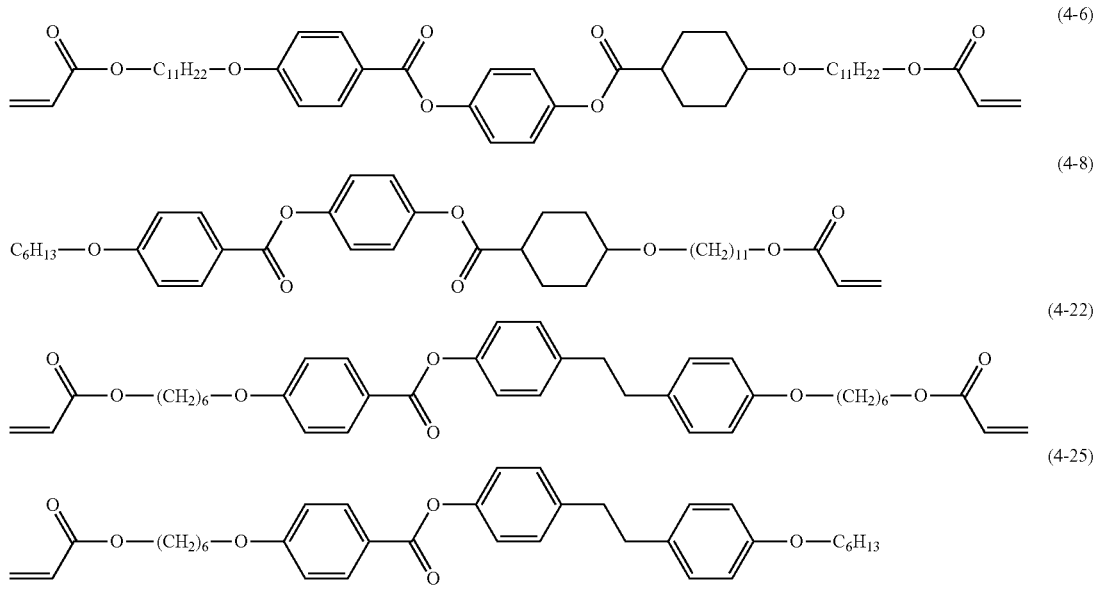

[Measurement of phase transition temperature]

The phase transition temperatures of the polymerizable liquid crystal compounds listed above were measured by obtaining phase transition temperatures of films derived from the respective polymerizable liquid crystal compounds as described below.

A film derived from the compound (4-6) was formed on a glass substrate on which an alignment film was formed. Then, while the film derived from the compound (4-6) was being heated, a phase transition temperature was measured by texture observation with use of a polarizing microscope (BX-51, manufactured by Olympus Corporation).

The results showed that while a temperature of the compound (4-6) was falling after rising to 120° C., a phase of the compound (4-6) transitioned to a nematic phase at 112° C., to a smectic A phase at 110° C., and to a smectic B phase at 94° C.

As in the measurement of the phase transition temperature of the compound (4-6), the phase transition temperature of the compound (4-8) was measured.

The results showed that while a temperature of the compound (4-8) was falling after rising to 140° C., a phase of the compound (4-8) transitioned to a nematic phase at 131° C., to a smectic A phase at 80° C., and to a smectic B phase at 68° C.

As in the measurement of the phase transition temperature of the compound (4-6), the phase transition temperature of the compound (4-22) was measured.

The results showed that while a temperature of the compound (4-22) was falling after rising to 140° C., a phase of the compound (4-22) transitioned to a nematic phase at 106° C., to a smectic A phase at 103° C., and to a smectic B phase at 86° C.

As in the measurement of the phase transition temperature of the compound (4-6), the phase transition temperature of the compound (4-25) was measured.

The results showed that while a temperature of the compound (4-25) was falling after rising to 140° C., a phase of the compound (4-25) transitioned to a nematic phase at 119° C., to a smectic A phase at 100° C., and to a smectic B phase at 77° C.

Example 3

[Preparation of composition]

The following components were mixed and stirred at 80° C. for 1 hour, so that a composition (1) was obtained:
Polymerizable liquid crystal compound;
75 parts of the compound (4-6)
25 parts of the compound (4-8)
Compound (1); 2.5 parts of the compound (1-1)
Polymerization initiator; 6 parts of 2-dimethylamino-2-benzyl-1-(4-morpholinophenyl)butane-1-one (Irgacure369; manufactured by Ciba Specialty Chemicals Inc.)
Leveling agent; 1.5 parts of a polyacrylate compound (BYK-361N; manufactured by BYK-Chemie)
Solvent; 250 parts of chloroform

[Measurement of phase transition temperature]

As in the confirmation of the phase transition temperature of the compound (4-6), a phase transition temperature of components contained in the composition (1) was measured.

The results showed that while a temperature of the components was falling after rising to 140° C., a phase of the components transitioned to a nematic phase at 115° C., to a smectic A phase at 105° C., and to a smectic B phase at 75° C.

[Production and evaluation of polarizing film]

1. Formation of alignment film

A glass substrate was coated, by a spin coating method, with a 2 mass % aqueous solution of polyvinyl alcohol (Polyvinyl Alcohol 1000, completely saponified, manufactured by Wako Pure Chemical Industries, Ltd.), and then dried. Then, a film having a thickness of 100 nm was formed. Then, a surface of the film thus obtained was subjected to a rubbing treatment, so that an alignment film was formed. The rubbing treatment was carried out (i) by use of a semi-automatic rubbing device (product name: LQ-008 type, manufactured by Joyo Engineering Co., Ltd.), (ii) with the use of cloth (product name: YA-20-RW, manufactured by Yoshikawa Chemical Co., Ltd.), and (iii) under conditions where: the pushing amount was 0.15 mm; and the rotation speed was 500 rpm and 16.7 mm/s. By the rubbing treatment, a laminated body 1, in which the alignment film was provided on the glass substrate, was obtained.

2. Formation of polarizing film

The alignment film of the laminated body 1 was coated with the composition (1) by a spin coating method, dried by heating on a hot plate at 120° C. for 1 minute, and then rapidly cooled to room temperature, so that a dry film containing an aligned polymerizable liquid crystal compound was formed on the alignment film. Then, with use of a UV light irradiation device (SPOT CURE SP-7; manufactured by Ushio Inc.), the dry film was irradiated with ultraviolet light of a light exposure of 2000 mJ/cm² (based on a wavelength of 365 nm). This allowed the polymerizable liquid crystal compound to be polymerized while an alignment status was maintained, so that a laminated body 2, in which a polarizing film (1) was formed from the dry film, was obtained. In so doing, a thickness of the polarizing film, which was measured with a laser microscope (OLS3000 manufactured by Olympus Corporation), was 1.7 µm.

3. X-ray diffraction measurement

The polarizing film (1) was subjected to X-ray diffraction measurement with use of an X-ray diffraction instrument X'Pert PRO MPD (manufactured by Spectris Co., Ltd.). With use of Cu as a target, an X-ray, which was generated at an electric current of 40 mA and a voltage of 45 kV in an X-ray tube, entered the polarizing film (1), via a fixed divergence slit ½°, in a rubbing direction (the rubbing direction of an alignment film under a polarizing film had been obtained in advance). Then, the measurement was carried out by scanning an angle at which the X-ray entered the polarizing film (1), in a range of 2θ=4.0° to 40.0° in steps of 2θ=0.01671°. This resulted in a sharp diffraction peak (Bragg peak) which appeared in the vicinity of 2θ=20.1° and which had a half-value width of the peak (FWHM) of approximately 0.31°. In a case where an X-ray entered the polarizing film (1) in a direction perpendicular to the rubbing direction, similar results were obtained. An order period (d) obtained based on the peak point was approximately 4.4 Å. This indicates that a structure reflecting a higher-order smectic phase was formed.

4. Measurement of dichroic ratio

An absorbance ($A^1$) along a transmission axis and an absorbance ($A^2$) along an absorption axis at a maximum absorption wavelength were measured (i) with use of a device obtained by setting, onto a spectrophotometer (UV-3150, manufactured by Shimadzu Corporation), a folder which includes the laminated body 2 and (ii) by a double beam method. On a reference side of the folder, a mesh for cutting an amount of light by 50% was provided. Based on the absorbance ($A^1$) along the transmission axis and the absorbance ($A^2$) along the absorption axis thus measured, a ratio ($A^2/A^1$) was calculated, and was treated as a dichroic ratio. The maximum absorption wavelength ($\lambda_{max1}$) was 506 nm, and the dichroic ratio at this wavelength was such a high value as 52. It can be said that a polarizing film having a higher dichroic ratio is more useful.

Since a maximum absorption wavelength ($\lambda_{max2}$) of the compound (1-1) is 448 nm, it was confirmed that the maximum absorption wavelength ($\lambda_{max2}$) was shifted to a longer wavelength. This result showing the shifting of the maximum absorption wavelength to a longer wavelength indicates the following: In a case where the compound (1-1) is dispersed between dense molecular chains obtained by polymerization of a polymerizable liquid crystal compound in a polarizing film in accordance with an embodiment of the present invention, the compound (1-1) and the molecular chains interact closely with each other.

A light-resistance was also evaluated by (i) providing a protection film (40-µm TAC "KC4UY" manufactured by Konica Minolta, Inc.) on a surface of the polarizing film (1) and (ii) irradiating the surface with light from above under the conditions described below. An absorbance of the polarizing film (1) after the light-resistance test at the maximum absorption wavelength (of 506 nm) of the polarizing film (1) was 87% of the light-resistance before the test. Meanwhile, a light-resistance test was carried out on a polarizing film formed by a method similar to that described above with use of a dichroic pigment represented by the Formula (1-10) disclosed in Japanese Patent Application Publication, Tokukai, No. 2013-101328. The results showed that an absorbance of the polarizing film after the light-resistance test at the maximum absorption wavelength (of 548 nm) of the polarizing film was 47% of the light-resistance before the test. That is, it was confirmed that the compound in accordance with an embodiment of the present invention is superior in light-resistance.

Light irradiation in the light-resistance test was carried out under the following conditions:
Device used: SUNTEST XLS+manufactured by ATLAS
Light source used: xenon arc lamp
Exposure conditions: 250 mW/m²
Testing time: 120 hours
Exposure amount: 108000 KJ/m²
Temperature: 60° C.

Example 4

A polarizing film in accordance with an embodiment of the present invention was produced as in Example 5 except that the compound (1-16) was used instead of the compound (1-1). The results of measuring a maximum absorption wavelength and a dichroic ratio as in Example 3 showed that (i) the maximum absorption wavelength ($\lambda_{max1}$) was 509 nm and (ii) the dichroic ratio was such a high value as 51.

As described in Example 2, since a maximum absorption wavelength ($\lambda_{max2}$) of the compound (1-16) is 458 nm, it was confirmed that the maximum absorption wavelength ($\lambda_{max2}$) was shifted to a longer wavelength. This result indicates the following: In a case where the compound (1-16) is dispersed between dense molecular chains obtained by polymerization of a polymerizable liquid crystal compound in the polarizing film in accordance with an embodiment of the present invention, the compound (1-16) and the molecular chains interact closely with each other.

INDUSTRIAL APPLICABILITY

A compound in accordance with an embodiment of the present invention is a novel compound serving as a dichroic pigment which has a maximum absorption wavelength in a range of 350 nm to 510 nm. The compound allows a polarizing film, which has a high dichroic ratio, to be obtained from a composition containing the compound. A compound in accordance with an embodiment of the present invention and a composition containing the compound can each be widely used in the fields of producing (i) a polarizing film, (ii) a liquid crystal display device including a polarizing film, (iii) a liquid crystal cell including a polarizing film, (iv) a circularly polarizing plate including a polarizing film, and (v) an organic EL display device including a polarizing film.

REFERENCE SIGNS LIST

210 First roll
210A Core
211A, 211B Coating device
212A, 212B Drying furnace
213A Polarized UV light irradiation device
213B Active energy ray irradiation device
220 Second roll
220A Core
230 Third roll
230A Core
240 Fourth roll
240A Core
300 Auxiliary roll

The invention claimed is:

1. A compound represented by the following Formula (1):

$$R^1-\underset{(R^2)_m}{\underset{|}{\bigcirc}}-N=N-\underset{(R^3)_p}{\underset{|}{\bigcirc}}-N=N-\underset{(R^4)_q}{\underset{|}{\bigcirc}}-N\underset{H}{\overset{R^5}{<}} \quad (1)$$

where: $R^1$ represents a hydrogen atom, a C1-C20 alkyl group, a C1-C20 alkoxy group, a C1-C20 acyl group, a C2-C20 alkoxycarbonyl group, a C1-C20 acyloxy group, or $-N(R^{10})(R^{11})$; $R^{10}$ represents a C1-C20 acyl group, a C1-C20 alkylsulfonyl group, or a C6-C20 arylsulfonyl group; and $R^{11}$ represents a hydrogen atom or a C1-C20 alkyl group; $R^{10}$ and $R^{11}$ can bond to each other, and form, with a nitrogen atom to which $R^{10}$ and $R^{11}$ bond, a ring including $-N-CO-$ or $-N-SO_2-$; at least one hydrogen atom of any of the alkyl group, the alkoxy group, the acyl group, the alkoxycarbonyl group, the acyloxy group, the alkylsulfonyl group, and the arylsulfonyl group can be substituted by a halogen atom, a hydroxy group, an unsubstituted amino group, or a substituted amino group; $-O-$ or $-NR^{20}-$ can be inserted between carbon atoms of any of the alkyl group and the alkoxy group; and $R^{20}$ represents a hydrogen atom or a C1-C20 alkyl group;

$R^2$ through $R^4$ are substituents which are not hydrogen atoms and each independently represent a C1-C4 alkyl group, a C1-C4 alkoxy group, a halogen atom, or a cyano group; at least one hydrogen atom of any of the alkyl group and the alkoxy group can be substituted by a halogen atom or a hydroxy group; and m, p, and q are each independently an integer of 0 to 2; and $R^5$ is a C1-C10 alkyl group in which a hydrogen atom is substituted by at least one hydroxy group; and the aliphatic hydrocarbon chain in $R^5$ can be a linear chain or a branched chain.

2. The compound as set forth in claim 1, wherein the compound is represented by the following Formula (1'):

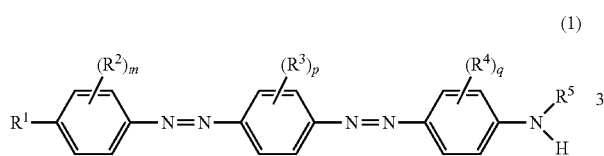

where: $R^1$ is identical to $R^1$ of Formula 1;
n represents an integer of 1 to 10; and
$-(CH_2)_n-$ represents a linear or branched C1-C10 aliphatic hydrocarbon chain.

3. The compound as set forth in claim 1, wherein the compound has a maximum absorption wavelength in a range of 350 nm to 510 nm.

4. A composition comprising:
a polymerizable liquid crystal compound; and
a compound recited in claim 1.

5. The composition as set forth in claim 4, wherein the polymerizable liquid crystal compound exhibits a smectic liquid crystal phase.

6. The composition as set forth in claim 4, further comprising:
a polymerization initiator.

7. A polarizing film comprising:
a compound recited in claim 1.

8. The polarizing film as set forth in claim 7, wherein a maximum absorption wavelength ($\lambda_{max1}$) of the polarizing film is longer than a maximum absorption wavelength ($\lambda_{max2}$) of the compound represented by the Formula (1).

9. The polarizing film as set forth in claim 8, wherein a difference between the $\lambda_{max1}$ and the $\lambda_{max2}$ is 10 nm or more.

10. The polarizing film as set forth in claim 7, wherein the polarizing film exhibits a Bragg peak in X-ray diffraction measurement.

11. A liquid crystal display device comprising:
a polarizing film recited in claim 7.

12. A liquid crystal cell comprising:
a polarizing film recited in claim 7;
a liquid crystal layer; and
a base.

13. The liquid crystal cell as set forth in claim 12, wherein the polarizing film is provided between the base and the liquid crystal layer.

14. The liquid crystal cell as set forth in claim 13, further comprising:
a color filter provided between the base and the liquid crystal layer.

15. A circularly polarizing plate comprising:
a polarizing film recited in claim 7; and
a quarter-wave plate.

16. An organic EL display device comprising:
a polarizing film recited in claim 7; and
an organic EL element.

17. An organic EL display device comprising:
a circularly polarizing plate recited in claim 15; and
an organic EL element.

18. A polarizing film comprising:
a compound recited in claim 2.

19. The polarizing film as set forth in claim 18, wherein a maximum absorption wavelength ($\lambda_{max1}$) of the polarizing film is longer than a maximum absorption wavelength ($\lambda_{max2}$) of the compound represented by the Formula (1').

* * * * *